United States Patent
Dow et al.

(10) Patent No.: US 7,443,236 B2
(45) Date of Patent: *Oct. 28, 2008

(54) CDMA POWER AMPLIFIER DESIGN FOR LOW AND HIGH POWER MODES

(75) Inventors: Gee Samuel Dow, Westlake Village, CA (US); Jianwen Bao, Colfax, NC (US); Chun-Wen Paul Huang, Edison, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/784,541

(22) Filed: Apr. 6, 2007

(65) Prior Publication Data

US 2007/0188224 A1    Aug. 16, 2007

Related U.S. Application Data

(63) Continuation of application No. 10/807,764, filed on Mar. 23, 2004, now Pat. No. 7,202,736, which is a continuation-in-part of application No. 10/190,567, filed on Jul. 9, 2002, now Pat. No. 6,806,767.

(60) Provisional application No. 60/500,949, filed on Sep. 5, 2003.

(51) Int. Cl.
    *H03F 1/14*   (2006.01)

(52) U.S. Cl. .................. 330/51; 330/129; 330/302; 330/310

(58) Field of Classification Search .................. 330/133, 330/285, 129, 51, 302, 303, 310, 306
    See application file for complete search history.

(56) References Cited

U.S. PATENT DOCUMENTS

| | | | |
|---|---|---|---|
| 5,060,294 A * | 10/1991 | Schwent et al. | 330/51 |
| 5,423,074 A * | 6/1995 | Dent | 330/129 |
| 6,522,201 B1 * | 2/2003 | Hsiao et al. | 330/278 |
| 6,680,652 B2 * | 1/2004 | Hoheisel et al. | 330/302 |
| 6,724,255 B2 * | 4/2004 | Kee et al. | 330/251 |

* cited by examiner

*Primary Examiner*—Khanh V Nguyen
(74) *Attorney, Agent, or Firm*—Morgan, Lewis & Bockius LLP

(57) ABSTRACT

An amplifier circuit responsive to a power mode signal improves efficiency at low power levels without compromising efficiency at high power levels. At low power levels, high impedance is presented with suitable adjustment in the phase of the signal. Also, providing for predistortion linearization improves high power efficiency and switching the predistortion linearizer OFF at low power levels contributes little more than a small insertion loss. The power amplifier also uses a bias circuit incorporating a dual harmonic resonance filter to provide high impedance at a fundamental frequency and low impedance at a second harmonic. These properties are of particularly advantageous since amplifiers in cell-phones are used in low power modes most of the time although they are designed to be most efficient at primarily the highest power levels.

8 Claims, 16 Drawing Sheets

CDMA POWER AMPLIFIER DESIGN FOR LOW AND HIGH POWER MODES

CROSS-REFERENCE TO RELATED APPLICATIONS

This application is a continuation of prior U.S. patent application Ser. No. 10/807,764 filed on Mar. 23, 2004, now U.S. Pat. No. 7,202,736, which claims priority to U.S. Provisional Patent Application Ser. No. 60/500,949 filed Sep. 5, 2003 and is also a continuation-in-part of U.S. patent application Ser. No. 10/190,567 filed Jul. 9, 2002, now U.S. Pat. No. 6,806,767, all of which are incorporated herein by reference.

BACKGROUND OF THE INVENTION

1. Field of the Invention

The present invention relates generally to the field of power amplifiers in multi-band communication systems. More particularly, the present invention relates to circuitry associated with such power amplifiers, such as harmonic filters, impedance load switching circuits, pre-distortion phase filters, and the like.

2. Description of the Related Art

Several digital air interface standards have been developed for providing efficient digital communication of voice, data, fax and text messages under the umbrella of "personal communications services" or PCS. Operational PCS systems, such as systems based on the GSM TDMA (Time Division Multiple Access) or IS-95 CDMA (Code Division Multiplex Access) air interface standards, are being implemented in the United States in the 1900 MHz frequency range. Meanwhile, existing analog (AMPS) and digital (D-AMPS) at 800 MHz cellular systems continue to operate. Thus, there are presently operating in the United States analog and digital cellular systems at 800 MHz and digital PCS systems at 1900 MHz. Mobile subscribers who desire to receive services from systems operating at 800 MHz and from systems operating at 1900 MHz must either use two different mobile transceivers or use a single "dual-band" mobile transceiver which can receive and transmit radio frequency (RF) signals in both frequency bands.

Power control is essential to the smooth operation of CDMA communication systems. Output power for each individual user should be adjusted dynamically to maximize the system capacity because there are many users sharing the frequency spectrum, which requires resolution of the near-far multiple-access in a spread-spectrum system. For this reason, a typical CDMA handset is operated under a varied output condition. Data obtained from the field indicates that a CDMA cellular phone handset spends approximately 95% of its time transmitting output power in a range of 10-30 dB lower than its maximum rated output power. Recognizing this fact, most CDMA handset power amplifiers have lower power (LP) and high power (HP) modes of operation. The purpose of this two-mode operation is to improve the efficiency performance at the LP mode.

FIG. 1 shows a diagram of wireless voice communication device 100, such as a typical mobile phone handset for cellular telephone use. The device 100 includes a microphone 102 for converting audio signals to electrical signals and a transmitter 104 for transmitting the electrical signals. Device 100 also includes receiver 112 connected to speaker 114. Transmitter 104 and receiver 112 normally share antenna 110, although separate antennas may instead be provided.

Transmitter 104 includes, inter alia, speech coder 120 for encoding the electrical voice signals, which are forwarded to modulator 122. Depending on the power mode and network used, modulator 122 mixes the coded signals to the appropriate frequency band. For example, modulator 122 shifts the signal to approximately 800 MHz in the case of CDMA or 1900 MHz in the case of Wideband CDMA (WCDMA). Power amplifier/load switch 124 amplifies and impedance matches the signal. The load switch portion of power amplifier/load switch 124 matches the outgoing signal to the required impedance and may also filter out various signal harmonics. Impedance matching increases amplifier power efficiency and filtering harmonics reduces undesired interference. Isolator 106 and receive/transmit duplexer 108 connect power amplifier/load switch circuit 124 and antenna 110. Using this series of components device 100 may transmit RF signals using antenna 110.

Receiver 112 obtains a received RF signal from antenna 110 via duplexer 108. RF receiver 130 prepares the received RF signal for demodulation. Demodulator 132 demodulates the received RF signal to output a demodulated signal, and speech decoder 134 decodes the demodulated signal to form an audio signal for reproduction on speaker 114.

A significant portion of the power in a wireless communication device is dissipated in the power amplifier (PA) (e.g., power amplifier/load switch 124) and the efficiency of a power amplifier is predominately determined by its output load design. There are two main factors affecting the output load design: the class of operation (e.g., class-A, -A/B, -B, -C, -E, etc.); and the load impedance at the fundamental and harmonic frequencies. In a typical PA design, the load is designed to achieve the best efficiency performance at its highest output power. For those power amplifiers that need to have low signal distortion (such as CDMA PA), there are the additional linearity constraints.

Wireless communication devices typically transmit RF signals at a plurality of power levels. The efficiency of the PA, however, significantly varies over the output power range. Typically, the PA is designed to maximize efficiency at higher output power levels because current drain efficiency of the PA becomes more significant at higher output power.

One technique to improve power efficiency switches the quiescent current of the PA in response to a PA output high power (HP)/low power (LP) mode control change. In the HP mode, the PA is biased with high quiescent current in order to maximize its output current swing. Similarly, in the LP mode, the PA is biased with low quiescent current in order to reduce current consumption.

Another circuit technique for improving the efficiency for varied output power system is load switching—i.e., the output load is adjusted in accordance with the output power requirements. In a switched load circuit design, the operational efficiency of a power amplifier is dependent on load impedance. A PA generally designed for maximum output power operation, i.e., HP mode, "sees" a low impedance load. This is necessary to maximize the device's current swing. An undesirable side effect of providing this low impedance is that it often leads to a degraded efficiency when the output power level is low.

Load switching is known for multi-mode handsets that operate in several frequency bands. The power amplifiers in these devices, however, are optimized for the high power mode with the low power mode operations, when present, being relatively inefficient. Several approaches for multi-band power amplifier designs based on the discussed design approaches are described next.

U.S. Pat. No. 5,774,017 (issued to Adar) (henceforth referred to as the '017 patent), teaches a multiple-band amplifier. The '17 patent discloses a GaAs MMIC dual-band amplifier for wireless communications for operation at either the 800 MHz or the 1900 MHz band and it provides desired gain and input and output impedance. Switching impedance networks are used at the input and output of the amplifier to provide matching input impedance and desired output impedance for operation in the two bands. Switching impedance networks are also used between any successive stages of the amplifier to provide proper interstage impedance. The dual band amplifier includes a bias control circuit which biases the amplifier to operate in A, B, AB, or C mode. The amplifier can be used for the AMPS 800 or the GSM 900 operation or any other cellular operation such as the PCS 1900 and it can be switched between the two operations by simply applying a proper control signal to the amplifier.

U.S. Pat. No. 6,188,877 (issued to Boesch et al.) (henceforth referred to as the '877 patent) describes a dual-band, dual-mode power amplifier with reduced power loss. The disclosed power amplifier circuit has a driver amplifier stage including a low band driver amplifier and a high band driver amplifier. A final amplifier stage includes a linear mode amplifier for amplifying digitally modulated signals and a saturated (nonlinear) mode amplifier for amplifying frequency modulated (analog) signals. A switching network interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands. A matching circuit is coupled to the linear mode final amplifier for impedance matching and for separating D-AMPS (800 MHz band) and PCS (1900 MHz band) digital signals. A power impedance matching circuit is coupled to the output of the saturated mode final amplifier. In one embodiment, an isolator is coupled to the output of one or more of the low band or high band outputs of the duplex matching circuit. In the low band analog path, a duplexer is provided ahead of the coupling means for reducing the RF power requirements on the coupling means. The switching network and input filter stage may precede a driver amplifier stage.

U.S. Pat. No. 6,215,359 (issued to Peckham et al.) (henceforth referred to as the '359 patent) teaches impedance matching for a dual band power amplifier. It describes using a switched capacitor circuit to accomplish GSM/DCS dual band load impedance switching and high level harmonic suppression. The '359 patent discloses an exciter matching circuit, interstage matching circuit, and harmonic filter matching circuit to match impedances at the input to a two-stage PA, between the first stage and the second stage of the PA, and at the output of the PA for more than one frequency band of interest. In a GSM/DCS dual band radiotelephone, the matching circuits provide low return loss at 900 MHz when the dual band transmitter is operating in the GSM mode. The harmonic filter matching circuit also filters out signals at 1800 MHz, 2700 MHz, and high order harmonics. When the dual band transmitter is in DCS mode, however, the matching circuits provide a low return loss at 1800 MHz and filter out signals at 2700 MHz and harmonics of 1800 MHz.

FIG. 2 shows an output matching circuit 200 that operates in conjunction with power amplifier 202. The output matching circuit 200 of FIG. 2 is similar to that disclosed in U.S. Pat. No. 6,243,566 to Peckham et al. Output matching circuit 200 includes signal input node N21 that receives the output from power amplifier 202. First transmission line TL21 is connected between node N21 and second node N22 that is internal to circuit 200. Second transmission line TL22 is connected between second node N22 and third node N23. First capacitor C21 is connected between second node N22 and ground and second capacitor C22 is connected between third node N23 and fourth node N24, which may be an input to the next element or circuit, such as an isolator, in the overall device. Capacitor C22 acts as a DC blocking capacitor, allowing RF signals to pass therethrough.

The impedance of output matching circuit 200 is determined by the characteristics of the transmission lines and the capacitance of capacitor C21, which is configured to improve the efficiency at the high power levels. This choice of capacitor C21 to lower the impedance seen by power amplifier 202 also results in more effective treatment of interference. Such improvement at high power levels, however, also results in reduced average power efficiency due to reduced efficiency in the low power mode, which was noted to be the mode in which 95% of time was spent by CDMA sets. Thus, the typical design of power amplifiers, although optimized for high power mode, actually results in reduced battery life.

FIG. 3 shows load switching circuit 300 that operates in conjunction with power amplifier 302. Again, for simplicity, only circuit 300 is shown in detail, it being understood that more than one type of amplifier may work with circuit 300. The load switching circuit 300 of FIG. 2 is not unlike that disclosed in FIG. 13 of U.S. Pat. No. 5,774,017 to Adar showing each capacitor C31, C32 connected to a separate switch, the two switches acting in a complementary and mutually exclusive manner to provide different load impedances for different frequency bands of operation.

Circuit 300 includes signal input node N31 that receives the output from power amplifier 302. A first transmission line TL31 is connected between node N31 and second node N32, which is internal to circuit 300. Second transmission line TL32 is connected between second node N32 and third node N33. First capacitor C31 is connected between second node N32 and switch SW31 and second capacitor C32 is connected between third node N33 and switch SW31. Circuit 300 also includes third capacitor C33 connected between third node N33 and fourth node N34, which may be an input to the next element or circuit, such as an isolator, in the overall device. Capacitor C33 acts as a DC blocking capacitor, allowing RF signals to pass therethrough.

Switch SW31 is an electronic switch connecting either C31 or C32 to ground at any given instant, depending on frequency band selector input 304. Switch SW31 is typically implemented by a transistor circuit which has two mutually exclusive outputs driven by frequency band selector input 304 from a logic circuit, a processor (not shown), or other such known device.

In response to a frequency band selector input signal of a first type (e.g., low voltage), capacitor C31 is coupled to ground via switch SW31 and capacitor C32 is unconnected to ground. Transmission lines TL31, TL32 and capacitor C31 operate in conjunction with power amplifier 302 to provide a first predetermined output impedance suitable for operation at 1900 MHz, for example.

Similarly, in response to a mode signal of a second type (e.g., high voltage), capacitor C32 is coupled to ground via switch SW31 and capacitor C31 is unconnected to ground. In such case, transmission lines TL31, TL32 and capacitor C32 operate in conjunction with power amplifier 302 to provide a second predetermined output impedance suitable for operation at a second frequency band such as for example at 800 MHz.

The prior art does not teach or suggest selecting the output matching impedance to improve operation at an output power levels other than at high power even though CDMA phones actually spend an overwhelming amount of their operational time in relatively lower power modes.

The high power performance of a power amplifier is often compromised by the distortion or noise generated as a result of such an operation. Using a predistortion linearizer adversely impacts the performance in lower power modes due to the weak input signals. A useful discussion of predistortion linearizers is found in "Diode Predistortion Linearization for Power Amplifier RFICs in Digital Radios." by Christopher B. Haskins presented in the part fulfillment of the Master of Science degree at Virginia Polytechnic Institute and State University on Apr. 17, 2000 and is herein incorporated by reference in its entirety. Such limitations on the use of predistortion linearizers require that a choice be made between superior performance in a high power mode and the performance in a lower power mode.

SUMMARY OF THE INVENTION

The drawbacks and shortcomings described previously are overcome by the disclosed invention by providing a variable load circuit to provide a two-state or multi-state load design. For example, low impedance is provided for high power operation and a high impedance state provided for low power operation. The load is adjusted via a "switching" operation based, in part, on the operating power level of the amplifier. In order to achieve improved efficiency performance at lower output power levels, the output device needs to "see" a higher impedance load. This follows from the fact that higher load impedance reduces the current swing for the low power mode. On the other hand, providing low impedance at high power levels avoids sacrificing efficiency at higher power levels.

In a preferred embodiment of the invention, an amplifying circuit includes an amplifier and an amplifier load circuit, both responsive to a power mode signal. Preferably, an amplifier load circuit input node is connected to an output node of the amplifier to form the amplifier load circuit. The amplifier and the amplifier load circuit of the present invention may, preferably, be implemented as GaAs integrated circuits.

In another aspect, the amplifying circuit may include a filter to reduce harmonics and provide high impedance in the low power mode. Preferably, a dual harmonic filter arrangement is incorporated in the output load such that an open circuit is presented at the fundamental frequency and a short circuit presented at a harmonic frequency of interest. Preferably, the dual harmonic filter is integrated into the bias circuit providing power to one or more stages in the amplifier. However, in alternative embodiments of the invention other placements of the dual harmonic filter, for instance, as part of the amplifier load circuit, are also intended to be within the scope of the invention.

In another aspect, the invention includes embodiments with a switchable cubic predistortion linearizer (SCPDL) to improve the response in the higher power modes. A switch responsive to a signal for selecting a power mode also triggers the appropriate SCPDL functionality to improve the performance. Preferably, in two power mode designs, the lower power mode does not require SCPDL action and the transition to the high power mode also includes activation of the SCPDL. Preferably, SCPDL is placed at about the input of the power amplifier to better shape the input signal. Similar placement of a dual harmonic filter is also possible to reduce spurs and allow for other signal shaping, for instance, to correct signal distortions due to a transreceiver.

In an illustrative embodiment, the amplifier load circuit suitable for operation in a particular frequency band may include one or more of a dual resonance harmonic filter and a switchable harmonic filter for removing harmonics and correcting for signal distortion, preferably at higher power settings. Preferably, the switchable harmonic filter, if present, is coupled to a first capacitor and a first switch between a common node and ground, wherein the first switch is responsive to the power mode signal. Alternatively, the amplifier load circuit may have the dual resonance harmonic filter as part of the biasing circuitry. Another alternative embodiment includes a second capacitor and a second switch connected to one another in series, between a second node and ground, wherein the second switch is responsive to a band select signal.

In one aspect, the amplifier load circuit may include a plurality of transmission line segments to provide suitable loads in different frequency bands with a harmonic filter or a dual resonance harmonic filter coupled between the load circuit input node and a common node; a first capacitor coupled between the first node and the common node; a first switch coupled between the common node and ground; and a second capacitor and a second switch connected to one another in series between the second node and ground; wherein the first switch is responsive to said power mode signal and the second switch is responsive to a band select signal to further improve amplifier efficiency in the low power mode(s).

In another aspect, while the use of one or two switches is described, additional switches may be used, preferably, to implement a plurality of power levels and frequency bands of operation. The number of switches is preferably kept low to reduce switching losses. In addition, a single switch may respond to both the power mode and band select signal or multiple switches may respond to a power mode or band select signal.

The power mode signal may correspond to one of a low power mode signal and a high power mode signal, the low power mode signal may correspond to a low-power mode of the amplifier, and the high power mode signal may correspond to a high-power mode of the amplifier. The low power mode signal, which preferably has a voltage of about 0V, may open the first switch, and the high power mode signal, which may have a voltage of about 3V, may close the first switch.

In another preferred aspect of the present invention, the harmonic filter may comprise a filter inductor and a filter capacitor. The filter inductor may have an inductance of approximately 0.75 nH and the filter capacitor may have a capacitance of approximately 14 pF. The first transmission line may have an impedance of approximately 75 ohms.

Alternatively, the harmonic filter may, preferably, be a dual harmonic filter, which exhibits higher impedance at the fundamental than the series LC filter and low impedance at the second harmonic. The high impedance at the fundamental exhibited by a dual resonance harmonic filter prevents detuning in the low power mode while leaving the load matching properties relatively unaffected.

In yet another aspect, the amplifier circuit of the present invention may further comprise: a transmission line coupled to the amplifier output node; an inductor coupled between the transmission line and a battery voltage input node; and a capacitor coupled between the battery voltage input node and ground.

The amplifier of the present invention may include a phase shift circuit coupled to an power amplifier input node, a first amplifier stage coupled to the phase shift circuit, and a second amplifier stage coupled between the first amplifier stage and a power amplifier output node, wherein the phase shift circuit, a plurality of amplifier stages are responsive to the power mode signal.

In one embodiment, the phase shift circuit may comprise a second capacitor coupled between the power amplifier input node and a first internal node; an inductor coupled between the first internal node and a second internal node; a third capacitor coupled between the second internal node and the first amplifier stage; a first diode coupled between the first internal node and ground; and a second diode coupled between the second internal node and ground, wherein the power mode signal is input to the first internal node.

In another embodiment, the phase shift circuit may comprise a second capacitor coupled between the power amplifier input node and a first internal node; an inductor coupled between the first internal node and a second internal node; a third capacitor coupled between the second internal node and the first amplifier stage; a fourth capacitor coupled between the first internal node and a third internal node; a fifth capacitor coupled between the second internal node and the third internal node; and a third switch coupled between the third internal node and ground, wherein the third switch is responsive to the power mode signal.

The power amplifier's first amplifier stage may comprise a first transistor having a first transistor base, a first transistor emitter and a first transistor collector; and a first current mirror circuit configured to stabilize a voltage at the first transistor base, while the second amplifier stage may comprise a second transistor having a second transistor base, a second transistor emitter and a second transistor collector; and a second current mirror circuit configured to stabilize a voltage at the second transistor base, wherein the first and second current mirror circuits are responsive to the power mode signal.

The power amplifier's first amplifier stage may further comprise a first input match circuit coupled between the phase shift circuit and the first transistor base; a first output match circuit coupled between the first transistor collector and the second amplifier stage; and an inductor and transmission line connected between a first battery voltage input node and the first transistor collector, and a capacitor connected between said first battery voltage input node and ground, while the second amplifier stage may further comprise a second input match circuit coupled between the first output match circuit and the second transistor base; and an inductor and transmission line connected between a second battery voltage input node and the second transistor collector, and a capacitor connected between said second battery voltage input node and ground.

In another aspect, an embodiment includes a switchable cubic predistortion linearizer ("SCPDL") to further improve the response in the HP mode. Preferably, the SCPDL is responsive to a power mode select signal such that it contributes little more than a small insertion loss when the power amplifier is in a low power mode. However, when the power amplifier is in a high(er) power mode, SCPDL is invoked and improves the performance of the power amplifier. Preferably, SCPDL is coupled directly or indirectly to the input stage of the power amplifier. In combination with the choice of a suitable output impedance for the low power mode, an efficient and effective filter for removing one or more selected harmonics, SCPDL provides a power amplifier that provides an improved response in both the high power and low power modes.

BRIEF DESCRIPTION OF THE DRAWINGS

The invention will be described by reference to the preferred and alternative embodiments thereof in conjunction with the drawings in which.

DETAILED DESCRIPTION

Figure 1:
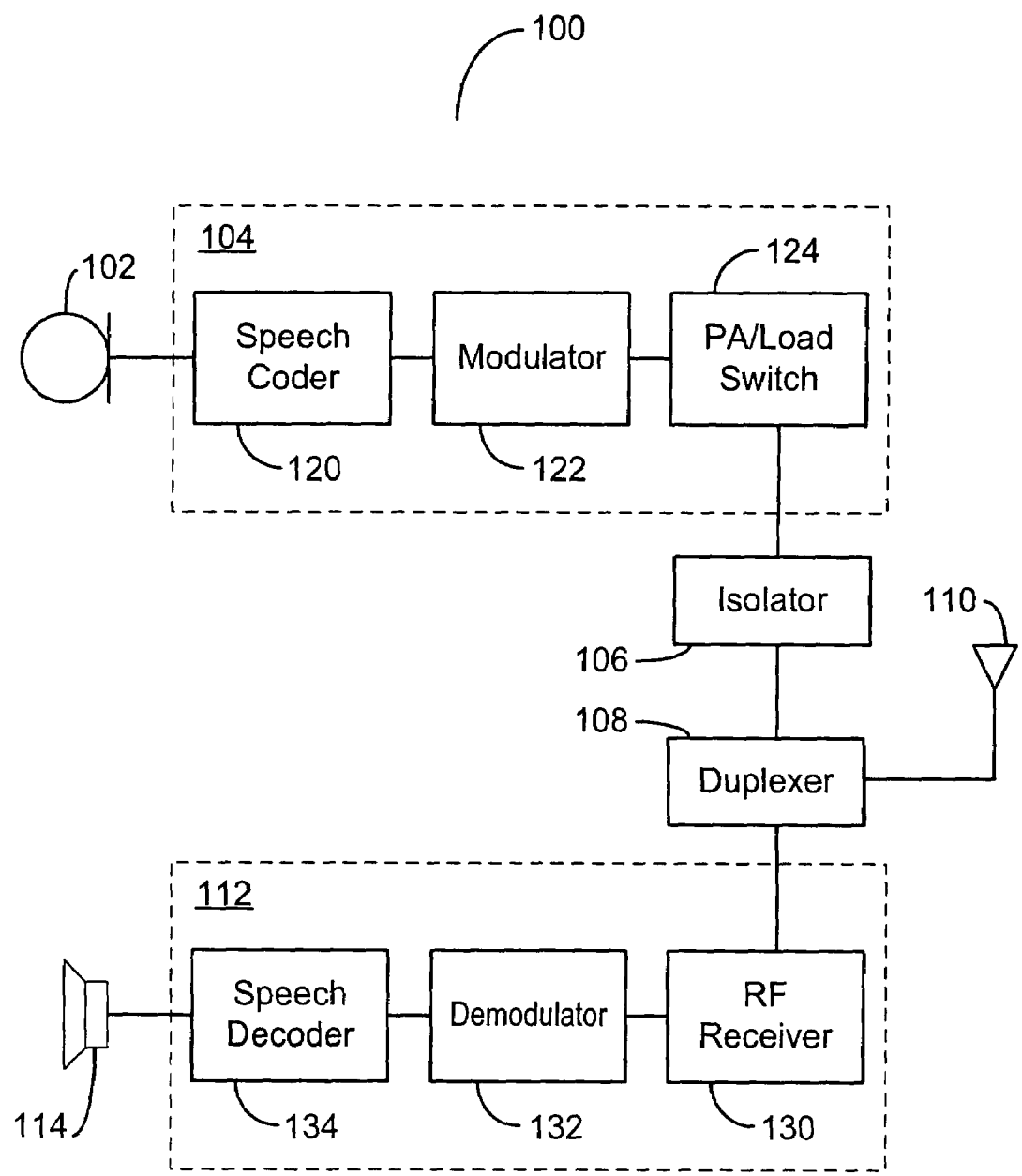
FIG. 1 shows a diagram of a wireless communication system having a power amplifier/load switch circuit.
Figure 2:
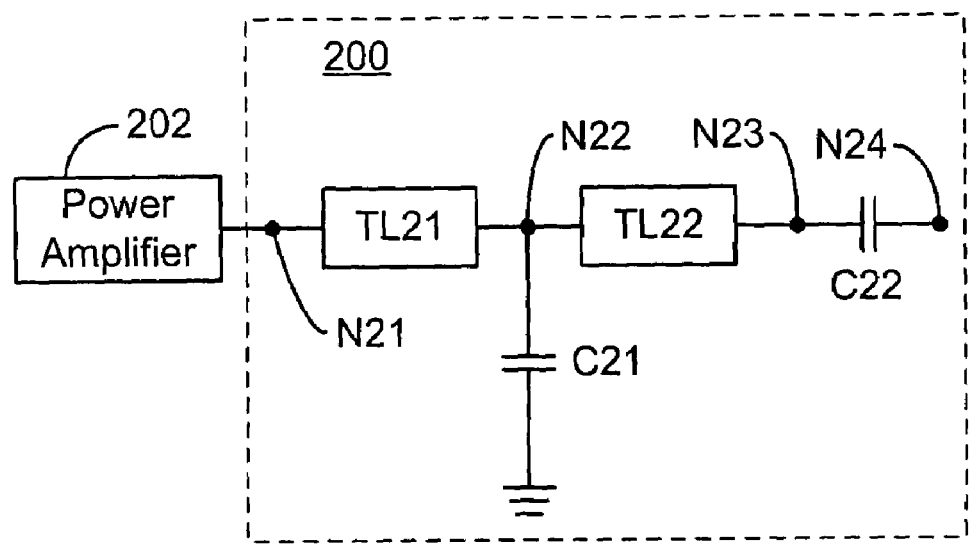
FIG. 2 shows a prior art load circuit.
Figure 3:
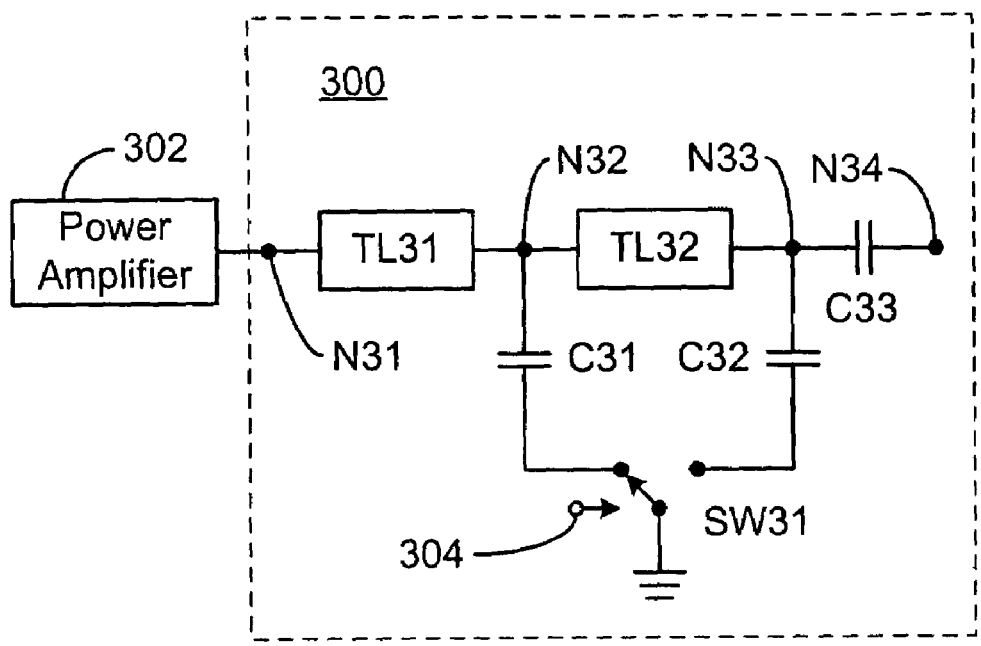
FIG. 3 shows another prior art load switching circuit.
Figure 4:
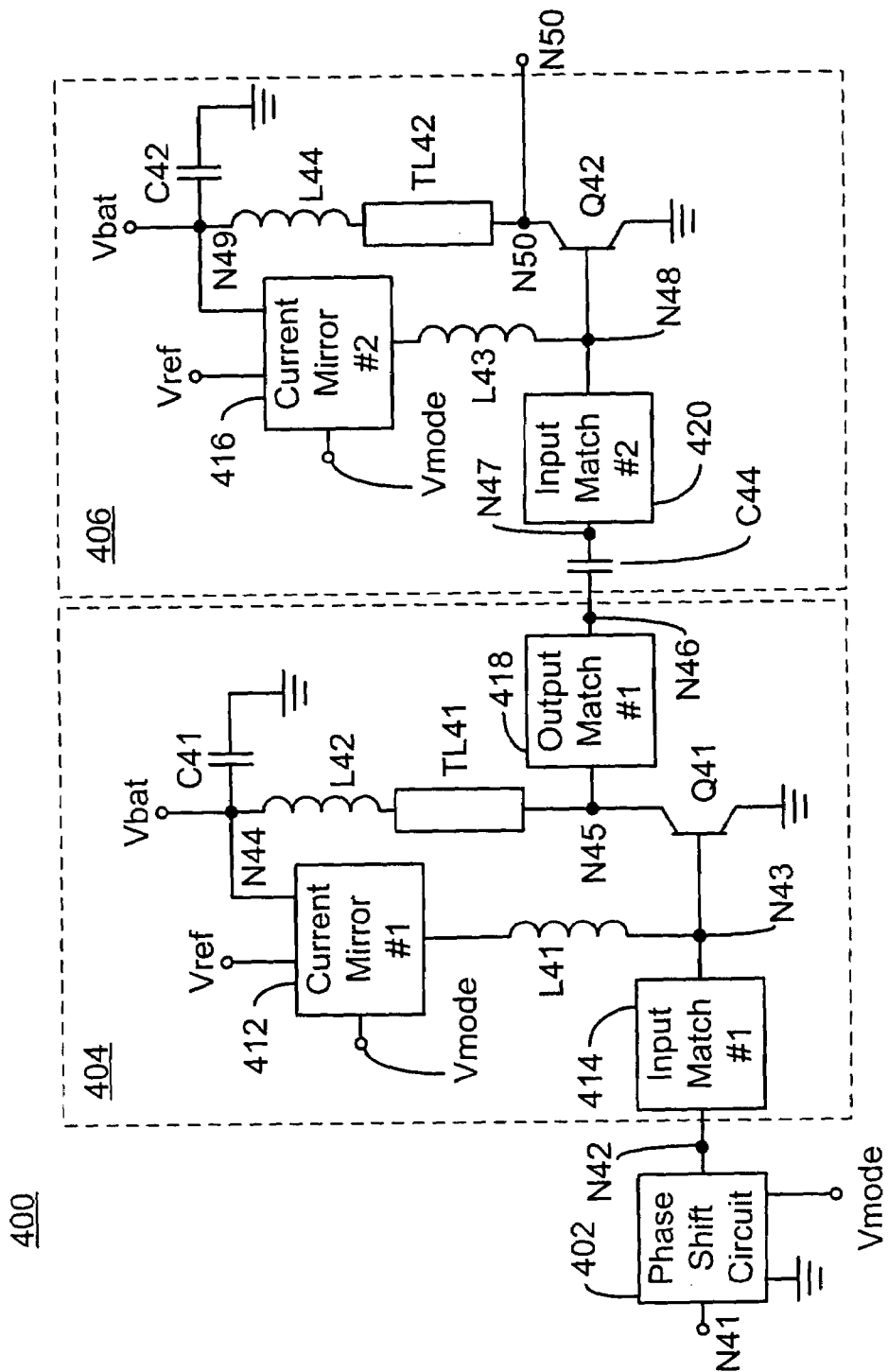
FIG. 4 shows a power amplifier in accordance with the present invention.

FIG. 4 shows power amplifier 400 in accordance with the present invention. Power amplifier 400 can serve as the power amplifier portion of power amplifier/load circuit 124 seen in FIG. 1. An RF signal input to power amplifier 400 at input node N41 may be phase shifted by phase shift circuit 402, first amplifier stage 404, and second amplifier stage 406, before exiting at output node N50.

Phase shift circuit 402 helps minimize phase discontinuity when switching between HP and LP modes in order to preserve phase coherency of the output signal. The RF signal at output node N42 is phase shifted relative to the signal at input node N41 depending on the Vmode signal.

As is known to those skilled in the art, the Vmode signal is a voltage level controlled by a dictated controller, such as a processor or the like, belonging to the device in which the power amplifier is resident. In the present invention such a controller (not shown) changes the value of the Vmode signal whenever there is change in the mode (low power to high power and vice versa). Thus, when the Vmode signal assumes a first value, the power amplifier is in low power mode and when the Vmode signal assumes a second value different from the first value, the power amplifier is in the high power mode. Without loss of generality, then, the first value may be zero volts and the second value may be 3 volts. It is understood, however that other voltages for each (and also other non-overlapping voltage ranges of each) are also possible. Such a controller may be found, for example, in a MODEM chip (not shown) that includes modulator 122 and demodulator 132. The controller may implement a closed-loop power control system and may automatically switch the Vmode signal based on, e.g., whether a high power or low power is needed by the PA.

First amplifier stage 404 provides an initial amplification of the RF signal. The first input matching circuit 414 provides interstage matching between the output impedance of the phase shift circuit 402 and the input impedance of the first amplifier stage 404.

Transistor Q41 is preferably a heterojunction bipolar transistor (HBT). First current mirror circuit 412, in conjunction with inductor L41, stabilizes the voltage at node N43 at the base of transistor Q41 such that transistor Q41 may operate uniformly over a range of temperatures. The emitter of transistor Q41 is connected to ground while the collector is connected, at node N45, to first output matching circuit 418 which imparts a suitable impedance to the partially amplified RF signal.

A battery voltage, Vbat, is connected to node N44 from which point it powers first current mirror circuit 412 and provides bias to transistor Q41. More particularly, Vbat is connected to the collector of transistor Q41 via inductor L42 connected in series with transmission line TL41. Transmission line TL41 may be implemented by a resistor. Vbat is also connected to ground via capacitor C41. Inductor L42, transmission line TL41, and capacitor C41 provide a low pass filter network such that transistor Q41 sees the proper DC bias and the power supply is protected from RF signal leakage into the power supply.

The partially amplified RF signal exiting first output matching circuit 418 first passes through DC blocking capacitor C44 situated between nodes N46 and N47. DC blocking capacitor C44 filters out the DC components of the partially amplified RF signal.

The second amplifier stage further amplifies the RF signal that originally entered phase shift circuit 402. Second input matching circuit 420 receives the DC-blocked, partially amplified RF signal and ensures that the base lead of transistor Q42 sees the desired impedance at node N48.

The circuit design of the remainder of second amplifier stage 406 is substantially the similar to that of first amplifier stage 404. Thus, second amplifier stage 406 includes second current mirror circuit 416 connected via inductor L43 to node N48 which, in turn, connects to the base lead of transistor Q42. In second amplifier stage 406, Vbat again powers the second current mirror circuit 416 via node N49 and also biases transistor Q42's collector at amplifier output node N50. And just as seen in the first amplifier stage 404, second amplifier stage 406 includes a low pass filter network formed by inductor L44 in series with transmission line TL42, along with capacitor C42. Thus, much like first amplifier stage 404, second current mirror circuit 416 and inductor L43 provide the base with a stabilized voltage. Also, the emitter of transistor Q42 is grounded and the collector of transistor Q42 is connected to amplifier output node N50.

The circuit of FIG. 4 functions as follows. When LP mode is desired, the controller (not shown) or other control circuitry causes the Vmode signal to assume a first value, such as a first voltage. When the Vmode signal is held at the first value, it enables the phase shift circuit 402 and controls current mirror circuits 412, 416 for LP bias. When HP mode is desired, the processor or other control circuitry causes the Vmode signal to assume a second value, such as a second voltage, which disables phase shift circuit 402 and controls current mirror circuits 412, 416 providing HP bias.

Table 1 shows some of the specifications for the components in FIG. 4. While specific values and descriptions of the components are shown, it is understood that these values are illustrative only. Alternative values may also provide acceptable performance. Furthermore, it is understood that the amplifier may be implemented as an integrated circuit, or even an application-specific integrated circuit (ASIC).

TABLE 1

Value/Description of Preferred Components in FIG. 4

| Component | Value/Description |
|---|---|
| Vref | 3.0 V |
| C41 | 100 pF |
| C42 | 100 pF |
| C44 | 10 pF |
| L41 | 5 nH |
| L42 | 3 nH |
| L43 | 5 nH |
| L44 | 3 nH |
| TL41 | 70 Ω and 20° @ 1 Ghz |
| TL42 | 70 Ω and 20° @ 1 Ghz |
| Q41 | 400 µm² |
| Q42 | 400 µm² |

Figure 5:
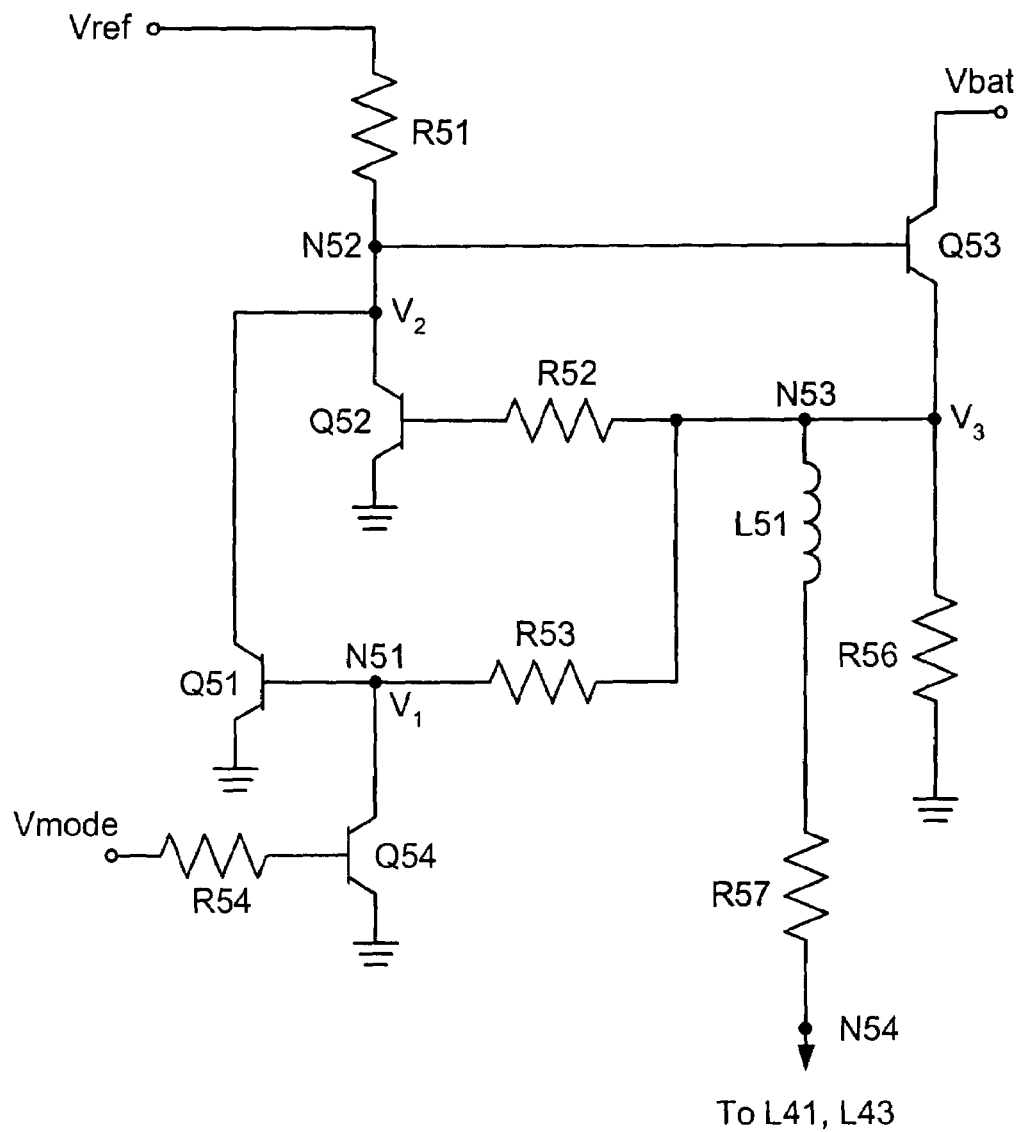
FIG. 5 shows the current mirror circuits of FIG. 4.

FIG. 5 shows a circuit diagram of a preferred embodiment of current mirror circuit 500 of the sort present in FIG. 4. As previously described, a current mirror circuit helps stabilize the voltage of the transistor base against temperature variations.

Current mirror circuit 500 has three inputs, Vbat, Vref, and Vmode, and outputs a signal at N54. Vbat provides the battery voltage to current mirror circuit 500. Vref supplies a reference voltage, and the Vmode signal controls the mode of current mirror circuit 500. The output of current mirror circuit 500 is connected to the base of the amplifying transistor shown in FIG. 4 via an inductor.

Current mirror circuit 500 has three internal nodes designated N51, N52, and N53 and four transistors designated Q51, Q52, Q53, and Q54. The battery voltage Vbat is supplied to the collector of transistor Q53. The base of transistor Q53 is tied to node N52 and its emitter connected to ground via serially connected resistor R56.

Node N53 is also further connected to output node N54 via serially connected inductor L51 and resistor R57. Node N53 is also connected to the base of transistor Q52 via current limiting resistor R52 and to the base of transistor Q51 via resistor R53.

The Vmode signal is applied to the base of transistor Q54 via resistor R54. The emitter of transistor Q54 is connected to ground and its collector is connected to node N51 that has internal voltage V1 and is connected to the base of transistor Q51.

The Vref input is connected to the collector of transistor Q52 via biasing resistor R51. Node 52, which is situated between resistor R51 and the collector of Q52, has internal voltage V2. Node N52 (and thus internal voltage V2) is connected to the base of transistor Q53. Node N52 is also connected to the collector of transistor Q51.

The operation of current mirror 500 is now described. The principle of current mirror 500 is the application of a matched base-emitter bias technique—i.e., when the same base-emitter (Vbe) voltage is applied to two matched transistors, and when one branch is set up to source a reference current by the reference transistor, it can be used to "program" the current that will flow in the load transistor. In FIG. 5, V3 represents the common Vbe voltage that is applied to reference transistors Q51, Q52 and load transistor Q42. The reference current, Iref, is the current that flows through R51 and is equal to (Vref−V2)/R51. In the LP mode bias, Vmode assumes a low value. In this case, transistor Q54 is biased off and voltage V3 turns on both transistors Q51 and Q52. In the case where current mirror 500 biases the amplifying transistor of the second stage shown in FIG. 4, the load current, IQ42=NLP*Iref, where NLP=(Transistor size of Q42)/(Transistor size of Q51+Q52). In the HP mode, Vmode assumes a high value. In this case, transistor Q54 is biased on and transistor Q51 is turned off. In this case, the load current, IQ42=NHP*Iref, where NHP=(Transistor size of Q42)/(Transistor size of Q52).

Thus, in the foregoing manner, current mirror circuit 500 provides temperature stabilization at the base inputs of transistors Q41, Q42 of FIG. 4. Table 2 presents illustrative values for the components in current mirror circuits 500.

TABLE 2

Preferred Components in Current Mirrors 412, 416

| Component | Value/Description for Current Mirror 412 | Value/Description for Current Mirror 416 |
|---|---|---|
| Vref | 3.0 V | 3.0 V |
| Q51 | 20 μm² | 40 μm² |
| Q52 | 20 μm² | 40 μm² |
| Q53 | 60 μm² | 120 μm² |
| Q54 | 20 μm² | 20 μm² |
| R51 | 400 Ω | 400 Ω |
| R52 | 1 kΩ | 2 kΩ |
| R53 | 1 kΩ | 2 kΩ |
| R54 | 5 kΩ | 5 kΩ |
| R56 | 2 kΩ | 500 Ω |
| R57 | 50 Ω | 20 Ω |
| L51 | 6 nH | 2 nH |

Figure 6:
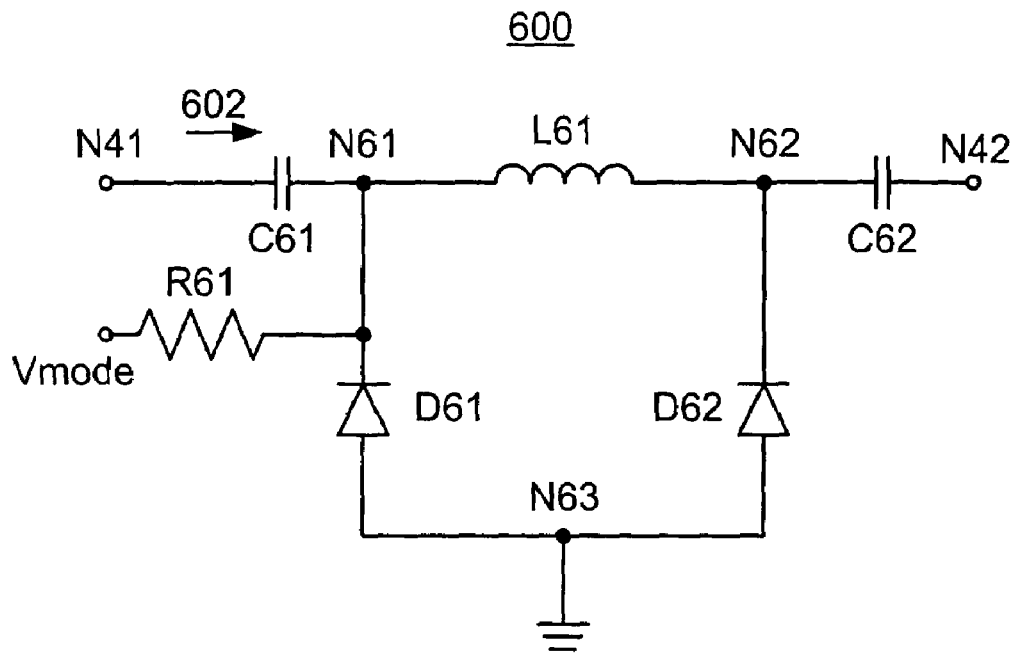
FIGS. 6 and 7 show two embodiments of the phase shift circuit of FIG. 4.
Figure 7:
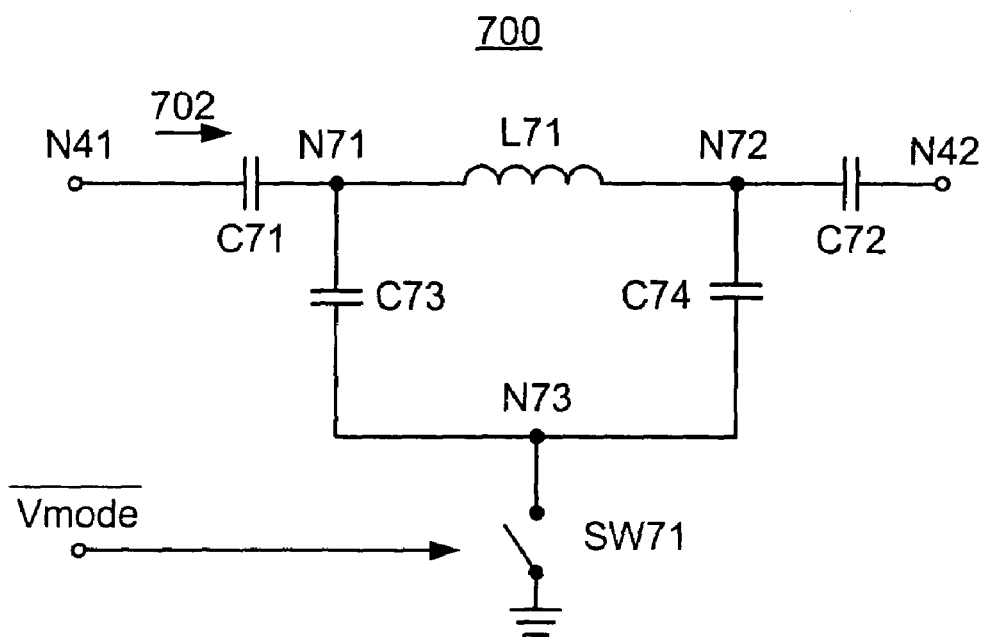

FIGS. 6 and 7 show first 600 and second 700 embodiments of the phase shift circuit 402 in FIG. 4. As previously described, phase shift circuit 402 helps minimize phase discontinuity when the Vmode signal switches between LP and HP modes. Phase shift circuit 402 receives an RF signal input at node N41 and outputs a phase-shifted version of the signal at node N42, with the Vmode signal controlling the behavior of phase shift circuit 402.

First phase shift circuit 600 in FIG. 6 includes internal phase shift signal path 602 defined by first RF blocking capacitor C61 connected in series with inductor L61 and second RF blocking capacitor C62 with internal node N61 defined between first capacitor C61 and inductor L61 and internal node N62 defined between inductor L61 and second capacitor C62. First phase shift circuit 600 also includes pair of diodes D61 and D62 which have their anodes connected to ground via common node N63 and their cathodes connected to nodes N61 and N62, respectively. D61 and D62 are biased via bias resistor R61 from the Vmode control.

The operation of first phase shift circuit 600 is now described. First phase shift circuit 600 consists of two shunt variable capacitors C61, C62 that were realized with reversed bias HBT Base-Collector junctions, diodes D61, D62 and series inductor L61. In a high power mode, both diodes are deactivated and the signal goes through C61, L61 and C62, where C61 and C62 are shorted at RF frequencies. In the low power mode, both diodes are reverse biased resulting in depletion capacitors. The amount of phase shift is determined by the capacitance values and the inductance values of these three components. In the HP mode, the Vmode may assume a low voltage value (e.g., 0V). This results in a higher capacitance value of the varactor, and therefore more phase shift for the network. In the corresponding LP mode, the Vmode assumes a high voltage value (e.g., ≧2.85 V). This results in a lower capacitance value of the varactor, and therefore less phase shift for the network. This relative phase shift is used to compensate the differential phase shift resulting from the switched load (discussed below) and consequently achieves phase synchronization for the overall system.

Second phase shift circuit 700, which responds to a $\overline{Vmode}$ signal having a high voltage for LP mode and low voltage for HP mode, has an embodiment shown in FIG. 7. It includes internal phase shift signal path 702 defined by first capacitor C71 connected in series with inductor L71 and second capacitor C72 with internal node N71 defined between first capacitor C71 and inductor L71 and internal node N72 defined between inductor L71 and second capacitor C72. Second phase shift circuit 700 also includes a pair of shunt capacitors C73, C74 connected between nodes N71 and N72, respectively, and common node N73. Common node N73, in turn, is connected to ground via switch SW71 that is responsive to the $\overline{Vmode}$ signal. SW71 is preferably implemented as a transistor switch, in a manner known to those skilled in the art.

The operation of second phase shift circuit 700 is now described. When the system is in LP mode, $\overline{Vmode}$ assumes a high voltage and causes switch SW71 to be closed. This causes the RF signal to enter the first phase shift signal path (corresponding to a long phase shift path) which consists of parallel capacitors C73 and C74 and series inductor L71. When the system is in HP mode, $\overline{Vmode}$ assumes a low voltage and causes switch SW71 to be opened. This causes the RF signal to enter the second phase shift signal path (corresponding to a short phase shift path) having only inductor L71.

Table 3 presents the values and characteristics of the components in first 600 and second 700 phase shift circuits, which achieve approximately 25° relative phase shift at approximately 850 MHz. The phase shift φ caused by first 600 and second 700 phase shift circuits can be approximately calculated by:

$$\phi = \tan^{-1}\left(\frac{X_n + 2B_n - X_n B_n^2}{2(1 - X_n B_n)}\right)$$

where $$X_n = \frac{j2\pi fL}{Z_0}, \quad B_n = j2\pi fCZ_0,$$

f is frequency, L is the inductance of corresponding inductor L61 or L71, C is the capacitance of capacitors C73, C74 or the depletion capacitance of diodes D61, D62, and $Z_0$ is the characteristic impedance of the source and load.

TABLE 3

Preferred Components in Phase Shift Circuits 600, 700

| Components in Phase Shift Circuit 600 | Value/Description | Components in Phase Shift Circuit 700 | Value/Description |
|---|---|---|---|
| C61 | 100 pF | C71 | 100 pF |
| C62 | 100 pF | C72 | 100 pF |
| L61 | 10 nH | L71 | 10 nH |
| D61 | 9600 μm² | C73 | 0.7 pF |
| D62 | 9600 μm² | C74 | 0.7 pF |

Figure 8:
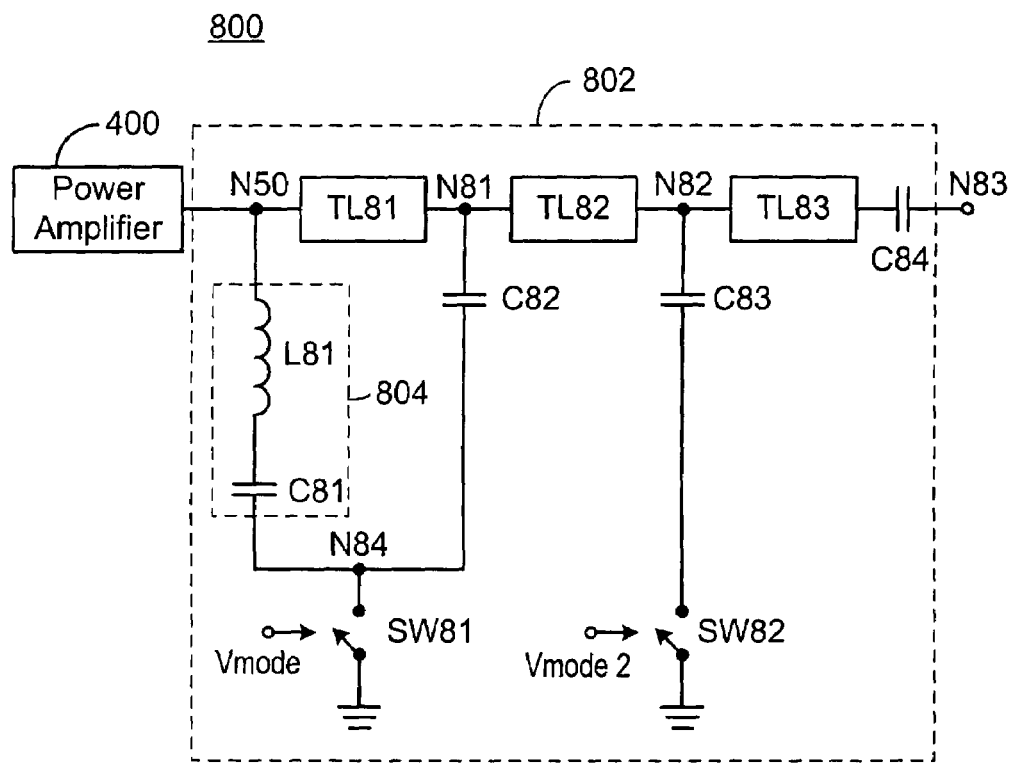
FIG. 8 shows a first embodiment of a combined harmonic trap/impedance load switching circuit in accordance with a first embodiment the present invention.

FIG. 8 shows combined power amplifier/load switching circuit 800 having load switching circuit 802 in accordance with the present invention. In FIG. 8, the output of power amplifier 400 at node N50 is presented to load switching circuit 802.

Load switching circuit 802 includes first transmission line TL81 connected between output node N50 and first internal node N81, second transmission line TL82 connected between first internal node N81 and second internal node N82, and third transmission line TL83 connected between second internal node N82 and DC blocking capacitor C84. In this manner, first, second, and third transmission lines TL81, TL82, and TL83, respectively, are serially connected between output node N50 and DC blocking capacitor C84. After passing through the three transmission lines, an amplified RF signal passes through the DC blocking capacitor before being output at load switching circuit output node N83.

Harmonic filter 804 (or a "harmonic trap") is connected between power amplifier output node N50 and common node N84. Harmonic filter 804 helps improve signal efficiency. In a typical large signal operation, amplifier stages 404, 406 generate spectral components at the harmonic frequencies of the input signal. These harmonics generate unwanted interference that should be suppressed. Harmonic filter 804 is employed on the output circuit of power amplifier 400 to suppress these unwanted harmonic frequency components. With proper design, harmonic filter 804 could also enhance the efficiency performance of power amplifier 400 due to its ability to shape the output voltage and current waveforms. In the embodiment shown in FIG. 8, harmonic filter 804 comprises filter inductor L81 in series with filter capacitor C81. Another capacitor C82 is connected between first internal node N81 and common node N84.

Common node N84 is connected to ground via switch SW81 responsive to the Vmode signal. Therefore, capacitor C82 and harmonic filter 804 are together selectively connected or disconnected to ground in response to the Vmode signal. And while FIG. 8 shows that switch SW81 alone is used to control the harmonic filter and capacitor C82 at common node N84, one skilled in the art will readily recognize that separate switches, each responsive to the Vmode signal, may be used to control each of these to ground, in which case there would be no common node N84.

As also seen in FIG. 8, second capacitor C83 is connected between second internal node N82 and ground via second switch SW82 responsive to a Band Select (or Vmode2) signal. Like the Vmode signal, the Band Select signal is also generated by a controller (not shown) associated with the device in which power amplifier/load switching circuit 800 resides. Band Select signal controls switch SW82 to selectively connect or disconnect capacitor C83 to ground.

Operation of load switching circuit 802 is now described. When the device is in the LP mode, switches SW81 and SW82 are both open. When both SW81 and SW82 are open, the signal at node N50 sees the full impedance presented by transmission lines TL81, TL82, and TL83. As such, a high impedance load (e.g., >20 ohms) is presented to the collector of transistor Q42 of the output device. With a high impedance load, the required current swing to deliver the targeted output power—for a handset PA, this is typically <15 to 20 dBm—will be much less than when a low impedance load is presented. This smaller current swing leads to improved efficiency performance at LP mode with a transistor capable of handling lower currents.

When the device is in the HP mode, a low impedance load should be presented to the collector of transistor Q42 of the output device. This is done by closing switch SW81 to allow the connection of load capacitor C82 to the output transmission line at node N81; furthermore, the closing of switch SW81 also activates harmonic filter 804, which suppresses the harmonic frequency components and improves the efficiency performance at high power level.

Switch SW82 is a band select switch. Switch SW82 allows the load in the HP mode to be adjusted in a straight-forward manner, thus enabling a dual-band, dual-mode PA operation under an external band select control.

In the 800-900 MHz spectrum, there are two major wireless communication standards—CDMA cellular, which occupies a frequency band of 824 MHz to 849 MHz, and the GSM band, which occupies a frequency band of 880 MHz to 915 MHz. A single 850 MHz PA can be designed to operate in both communication standards with the architecture illustrated in FIG. 8. For a GSM class 5 PA with an output power of 31.5 dBm, the required load impedance is approximately 3 ohms in a 3V battery system. With switch SW81 closed and switch SW82 open, a value of 75Ω and 10.5° @1 GHz for transmission line TL81 and 14.2 pF for capacitor C81, the desired load impedance of approximately 3 ohms in the frequency band of 880 to 915 MHz is achieved.

TABLE 4

Preferred components in Load Switching Circuit 802

| Component | Value/Description |
|---|---|
| L81 | 0.75 nH |
| C81 | 14 pF |
| C82 | 13.7 pF |
| C83 | 1.5 pF |
| TL81 | 75 Ω and 10.5° @ 1 GHz |
| TL82 | 75 Ω and 1° @ 1 GHz |
| TL83 | 50 Ω |

For a cellular CDMA PA with an output power of 28.5 dBm, the required output load impedance is also approximately 3 ohms in a 3V battery system. (CDMA PA is a linear power amplifier, typically operating around 4 dB backoff from the saturated output power of the amplifier.)

When both switches SW81 and SW82 are closed, and capacitor C83 of 1.0 pF is inserted into the output load, a load impedance approximately 3 ohms is achieved in the frequency band of 824-849 MHz. Table 4 summaries component values that may be used for the 800-900 MHz dual-band PA. The same technique can be also applied to a straight-forward implementation of a dual-band, dual-mode PA for DCS (1710-1785 MHz) and PCS CDMA (1850-1910 MHz) wireless communication standards.

Figure 9:
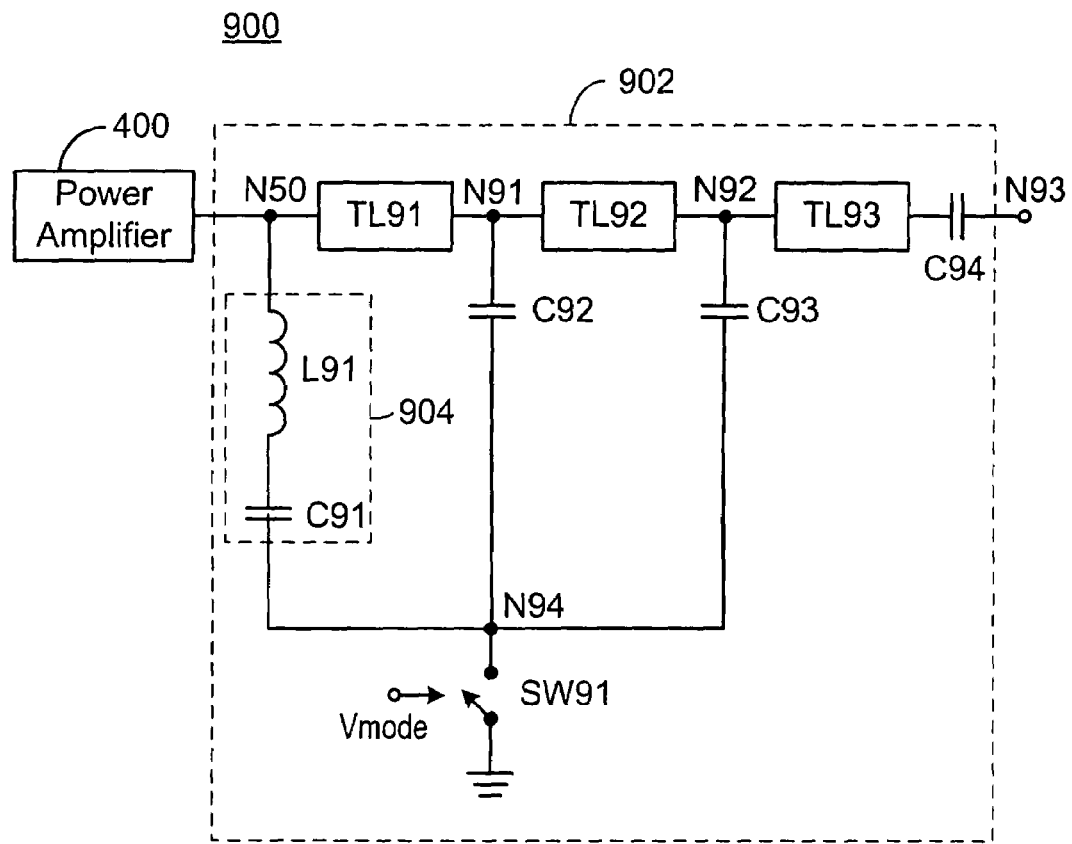
FIG. 9 shows another embodiment of a combined harmonic trap/impedance load switching circuit.

FIG. 9 shows combined power amplifier/load switching circuit 900 having load switching circuit 902 in accordance with the present invention.

Much of the design of load switching circuit 902 is similar to that of load switching circuit 802. Thus, load switching circuit 902 includes serially connected transmission lines TL91, TL92, TL93 with first N91 and second N92 nodes established between adjacent pairs of the transmission lines, and blocking capacitor C94 connected between transmission line TL93 and output node N93. Load switching circuit 902 also includes harmonic filter 904, shown as a dashed box to indicate that it represents several possible alternative filter designs, such as a dual harmonic filter. It should be noted that harmonic filters 804, 904 and 1004 in FIGS. 8-10 respectively are all illustrative only and may be replaced by other filter implementations such as dual harmonic filters in alternative preferred embodiments. For the sake of illustration, harmonic filter 904 is shown to comprise an inductor and capacitor connected in series. Thus, harmonic filter 904 comprises, in a preferred embodiment, inductor L91 and filter capacitor C91 connected in series between power amplifier output node N50 and common node N94. Like load switching circuit 802, load switching circuit 902 further has first capacitor C92 connected between first internal node N91 and common node N94. Furthermore, the common node N94 is connected to ground via a switch SW91 that is responsive to the Vmode signal.

In load switching circuit 902, however, second capacitor C93 is connected between second internal node N92 and common node N94, and so second capacitor C93 is not selectively connected to ground by a signal other than the Vmode signal. Therefore, in this embodiment, harmonic filter 904, first capacitor C92, and second capacitor C93 are all selectively connected or disconnected to ground in response to the Vmode signal.

As compared to load switching circuit 802, switched load capacitor C82 is now split into two—capacitors C92 and C93. The combined circuit of transmission lines TL91, TL92 and capacitors C92, C93 forms a two-section impedance transformation circuit which broadens the frequency bandwidth of the HP load design over the single-section impedance transformation network, leading to a design that is less sensitive to component variations in the manufacturing. Table 5 presents preferred component characteristics for load switching circuit 902.

TABLE 5

Preferred components in Load Switching Circuit 902

| Component | Value/Description |
| --- | --- |
| L91 | 0.75 nH |
| C91 | 14 pF |
| C92 | 10 pF |
| C93 | 8 pF |
| TL91 | 75 Ω and 7.5° @ 1 GHz |
| TL92 | 75 Ω and 6.0° @ 1 GHz |
| TL93 | 50 Ω |

In the embodiment of FIG. 9, single switch SW91 is used to control harmonic filter 904, first capacitor C92, and second capacitor C93. However, one skilled in the art will readily recognize that more than one switch may be used to simultaneously connect or disconnect harmonic filter 904 and capacitors C92 and C93 to ground, in response to the Vmode signal.

In a first variation, one may employ three separate switches, each responsive to the Vmode signal. In this first variation, the three switches selectively and individually connect each of harmonic filter 904, second capacitor C92, and third capacitor C93 to ground (in which case there would be no common node shared by the three elements).

In a second variation, one may employ two switches, both of which are responsive to Vmode. In this second variation, capacitors C92 and C93 are connected between the first N91 and second N92 internal nodes, respectively, to a common node. A first switch connects only harmonic filter 904 to ground and a second switch connects the common node to ground. Since switches are lossy components that degrade the efficiency performance of the HP mode, this second variation in which a single switch connects both capacitors C92, C93 to ground has the benefit of reducing the loss effect of the switches, thus, preserving the HP efficiency performance.

Figure 10:
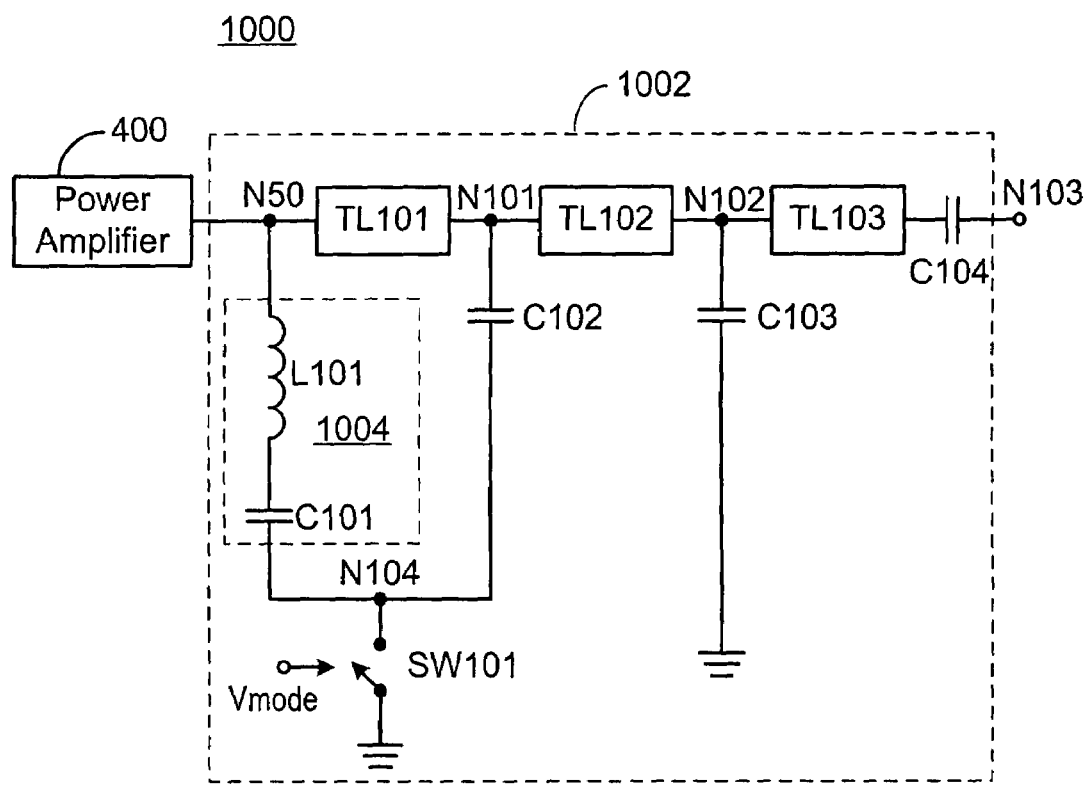
FIG. 10 shows another embodiment of a combined harmonic trap/impedance load switching circuit.

FIG. 10 shows combined power amplifier/load switching circuit 1000 having a third embodiment of load switching circuit 1002 in accordance with the present invention. Again, much of the design of load switching circuit 1002 is similar to that of load switching circuit 802. Thus, circuit 1002 includes serially connected transmission lines TL101, TL102, TL103 with first N101 and second N102 nodes established between adjacent pairs of the transmission lines, and blocking capacitor C104 connected between transmission line TL103 and output node N103. Load switching circuit 1002 also includes a harmonic filter 1004 comprising filter inductor L101 and filter capacitor C101 connected in series between power amplifier output node N50 and common node N104. Like load switching circuit 802, load switching circuit 1002 further has first capacitor C102 connected between the first internal node N101 and common node N104. Furthermore, common node N104 is connected to ground via switch SW101 that is responsive to the Vmode signal.

In load switching circuit 1002, however, second capacitor C103 is permanently connected between second internal node N102 and ground. Thus, unlike in load switching circuits 802 and 902, second capacitor C103 is not selectively connectable to ground and its connectivity is not impacted by either the Vmode signal of a Band Select signal.

Compared to load switching circuit 902, load switching circuit 1002 improves power efficiency in HP mode at the expense of the power efficiency in LP mode. This follows from the absence of a switch connected to capacitor C103, thus reducing the loss contribution in the HP mode; however, with capacitor C103 permanently connected to ground, the LP mode load impedance is now limited to a lower value. The design of load switching circuit 902 (of FIG. 9) is therefore best suited for a PA design where both HP and LP mode efficiencies need to be considered. Table 6 presents preferred component characteristics for load switching circuit 1002.

TABLE 6

Preferred components in Load Switching Circuit 1002

| Component | Value/Description |
| --- | --- |
| L101 | 0.75 nH |
| C101 | 14 pF |
| C102 | 12 pF |
| C103 | 4 pF |
| TL101 | 75 Ω and 10.0° @ 1 GHz |
| TL102 | 75 Ω and 2.0° @ 1 GHz |
| TL103 | 50 Ω |

Figure 11:
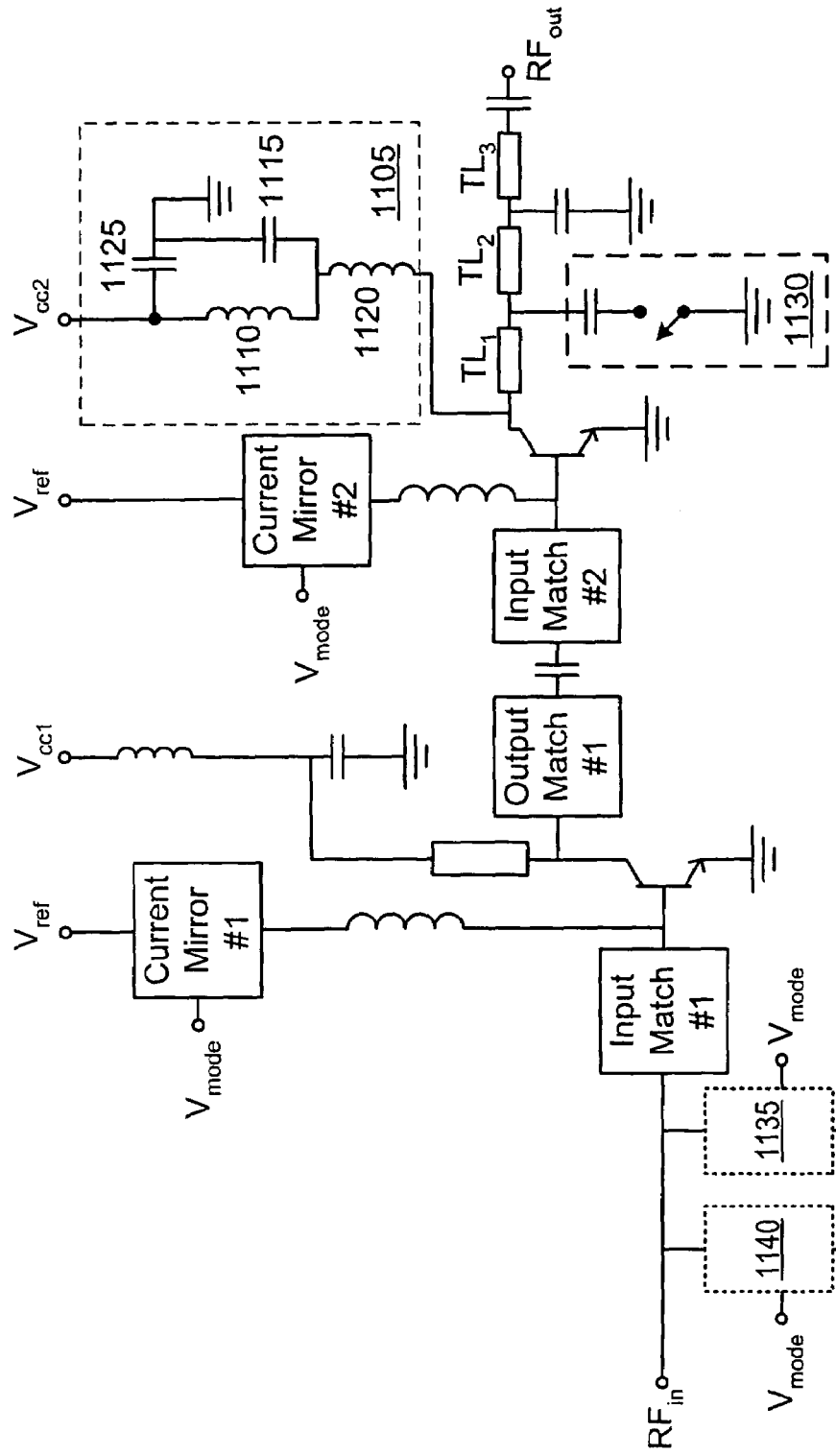
FIG. 11 shows an embodiment of the invention that incorporates a dual resonance harmonic filter in the bias circuit.

FIG. 11 illustrates another embodiment of the invention with a Dual Resonance Harmonic Trap that is preferably integrated with the bias circuit for the power transistor. This arrangement is more effective in suppressing undesirable harmonics and has the advantage of providing high impedance in the low power mode while providing improved efficiency in a low power mode and signal integrity in a high power mode. The incorporation of the dual resonance harmonic trap in the biasing circuit also provides the required current to the transistor in the power amplifier. Comparing FIG. 11 to FIGS. 4, and 8-10 reveals that instead of shunting away the harmonics from the output, this arrangement allows the harmonics to be filtered through the biasing arrangement for the power amplifier transistor(s) resulting in a higher impedance in the low power mode. The choice of parameters for the resonance harmonic trap is such as to provide an open circuit at the signal frequency and a short circuit at the second harmonic.

In FIG. 11, resonance harmonic trap 1105 comprises a tank circuit formed by inductor 1110, with inductance L2, capacitor 1115, with capacitance C1. The tank circuit is serially connected to inductor 1120, with inductance L1. In addition, capacitor 1125, with a suitable capacitance, provides a connection to the AC ground. The choice of L1, L2, and C1 is made to satisfy the requirement for an open circuit at the fundamental frequency and a short circuit at the second harmonic to provide effective filtering. This is illustrated in the equations presented below:

$$L_2 C_1 = \frac{1}{\omega_0^2};$$

wherein $\omega_0$ corresponds to the fundamental frequency. Thus, the tank circuit resonates and provides an open circuit at this frequency in the illustrative arrangement of FIGS. 11 and 12.

At the second harmonic, i.e., $2\omega_0$, the series combination of the tank circuit and series inductor 1120 provides a short circuit in accordance with the equation below:

$$2j\omega_0 L_1 + \frac{1}{2j\omega_0 C_1 + \frac{1}{2j\omega_0 L_2}} = 0$$

Accordingly, the design equations for the acceptable values of L1, L2, and C1 are $L_1:L_2=1:3$ and $L_1(nH)*C_1(pF) \approx 12 @ 836.5$ MHz. It should be noted that the equations presented are illustrative and similar results may be obtained with variations as is well known to one of ordinary skill in the art without departing from the spirit of the invention.

FIG. 11 also illustrates the use of predistortion linearizer 1135 and phase shift circuit 1140 at the input of the power amplifier. Both, predistortion linearizer 1135 and phase shift circuit 1140 are preferably responsive to the power mode signal. Preferably, predistortion linearizer 1135 is a switchable cubic predistortion linearizer, being switched by the power mode signal. However, it should be noted that although the use of a switchable predistortion linearizer is preferred, being switchable is not a threshold requirement for practicing the invention.

Figure 12:
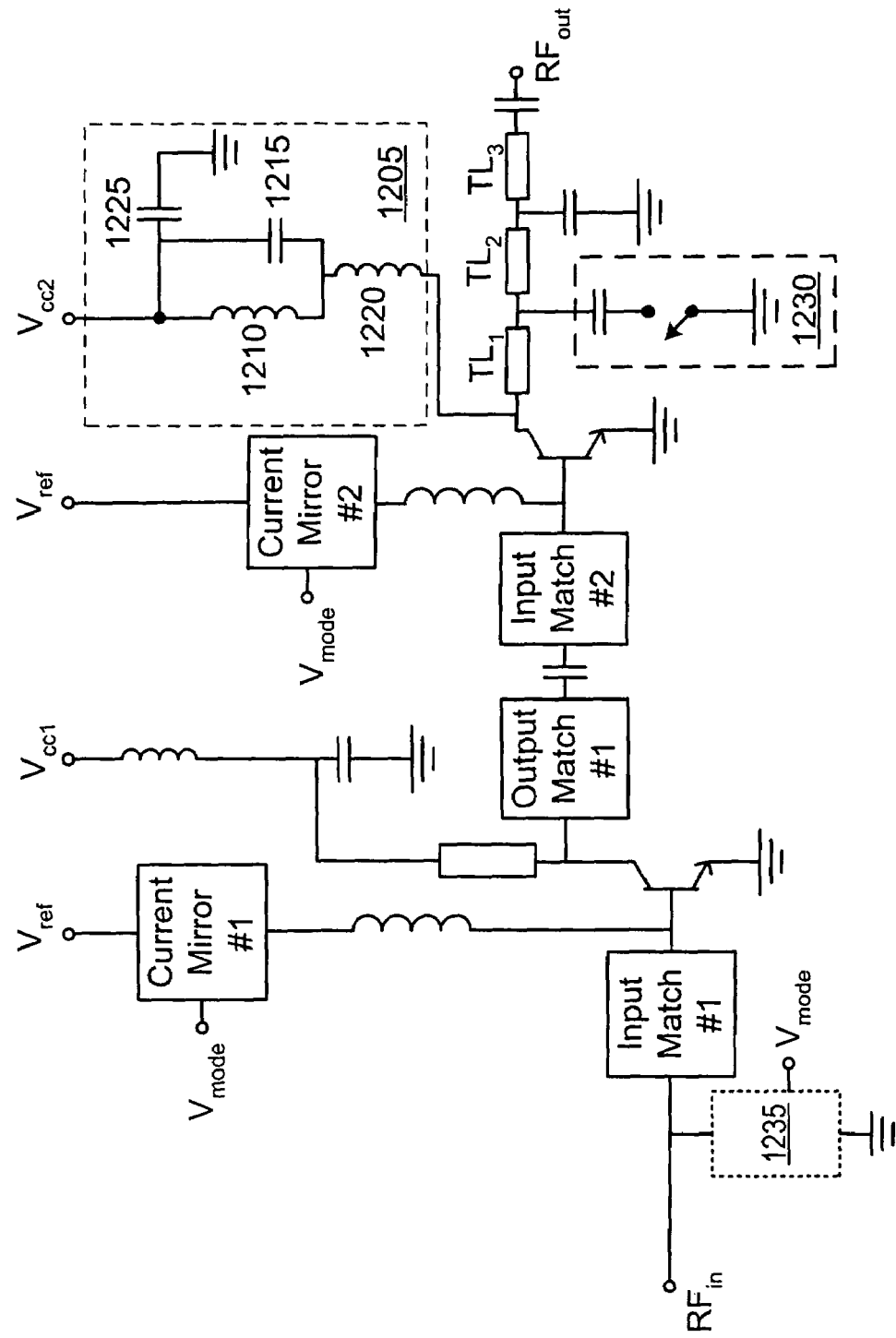
FIG. 12 shows an embodiment of the invention that incorporates a dual resonance harmonic filter in the bias circuit.

FIG. 12 illustrates another implementation of the Dual Resonance Harmonic Trap that is also preferably integrated with the bias circuit for the power transistor. As shown in FIG. 12, the tank circuit and the series inductor values are chosen as in the embodiment of FIG. 11. Capacitance 1225 is chosen to provide an AC ground. As may be expected, this arrangement is also effective in suppressing undesirable harmonics.

It should be noted that the dual resonance harmonic filter may be tuned to address other frequencies of interest as well. In general, at a second frequency $\omega_1$ different from $\omega_0$ we have:

$$j\omega_1 L_1 + \frac{1}{j\omega_1 C_1 + \frac{1}{j\omega_1 L_2}} = 0$$

which can be solved for a suitable value of L2 to provide a short circuit at $\omega_1$ while providing an open circuit at $\omega_0$. For example, if $\omega_1 = k*\omega_0$, the ratio between L1 and L2 is $$\frac{L_1}{L_2} = \frac{1}{k^2 - 1}.$$

Other exact or approximate relations can be deduced for aiding circuit parameter selection.

Figure 13:
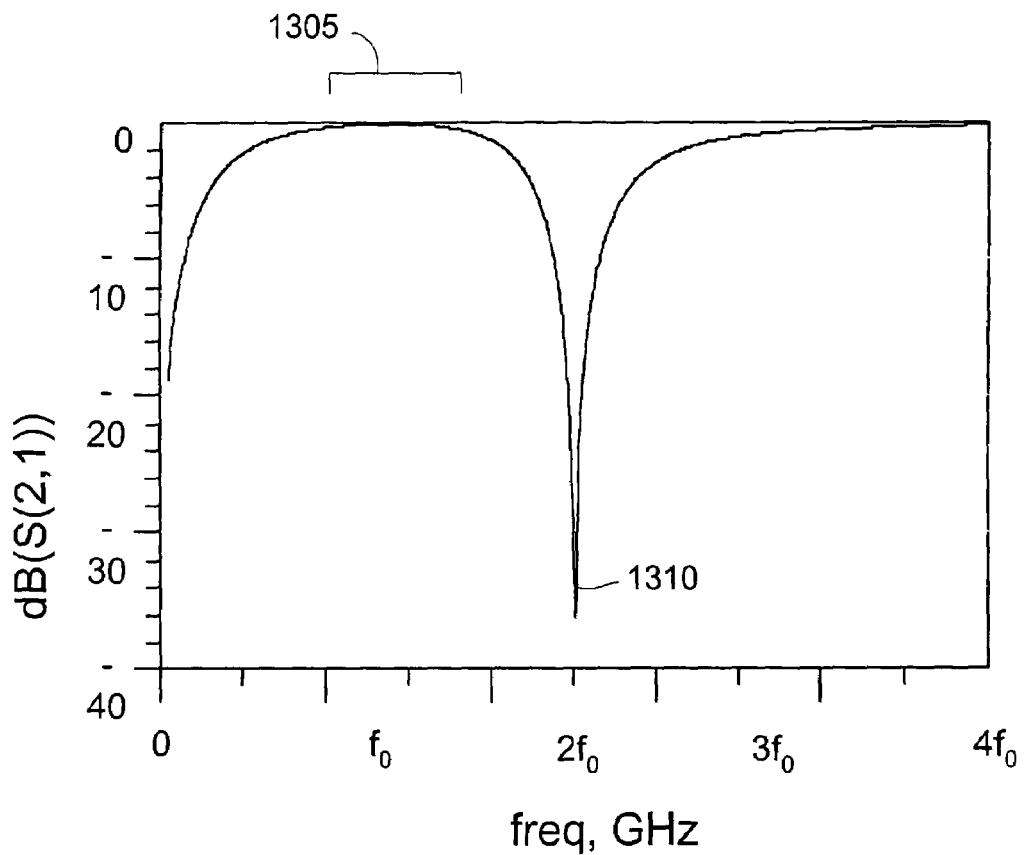
FIG. 13 illustrates the performance of a dual resonance harmonic filter in removing a frequency of interest while introducing a nominal insertion loss.

FIG. 13 illustrates the performance of a dual resonance harmonic filter in providing high impedance at a fundamental frequency while removing a harmonic by presenting a low impedance at the second harmonic. Advantageously, providing for a harmonic trap results in less than 0.2 dB insertion loss at the in-band frequency with attenuation of one or more unwanted frequencies due to either the source or power amplifier non-linearities. As shown, high impedance 1305 is presented at a fundamental frequency and at frequencies other than that for a second harmonic 1310 of the fundamental frequency. As is easily seen, a suitable choice of a 'fundamental' allows for implementation of a filter for unwanted spikes and other contributions due to signal distortions, amplifier non-linearity and the like.

Figure 17:
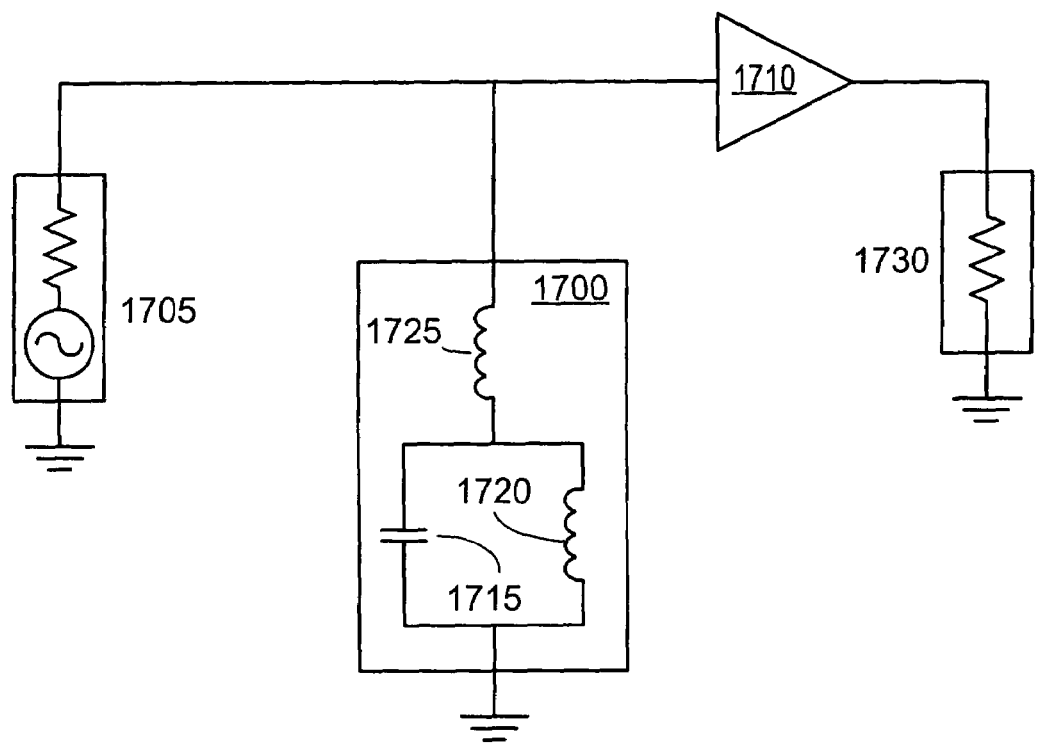
FIG. 17 illustrates a dual harmonic filter at the input of an illustrative circuit.

FIG. 17 illustrates an alternative placement and use of a dual harmonic resonance filter. In general, it is difficult to implement an on-chip matched or a packaged matched power amplifier with a low impedance trap without de-tuning the in-band matching condition. However, the in-band high impedance displayed by the harmonic trap overcomes this difficulty. In a preferred embodiment, a harmonic trap may be provided at the input of a power amplifier. Such a placement is shown in the illustrative FIG. 17. FIG. 17 shows harmonic trap 1700, comprising capacitor 1715 and inductors 1720 and 1725, placed at the input of amplifier 1710 to remove a frequency spur, for instance, due to processing by a transceiver chip 1705. Also shown is the load 1730 at the output of amplifier 1710. Harmonic trap 1700 is well suited to remove such an unwanted spur. In alternative preferred embodiments, a harmonic trap may be provided at both the input and the output of the power amplifier, or elsewhere in the circuit to shape the signal by removing unwanted frequencies.

Figure 14:
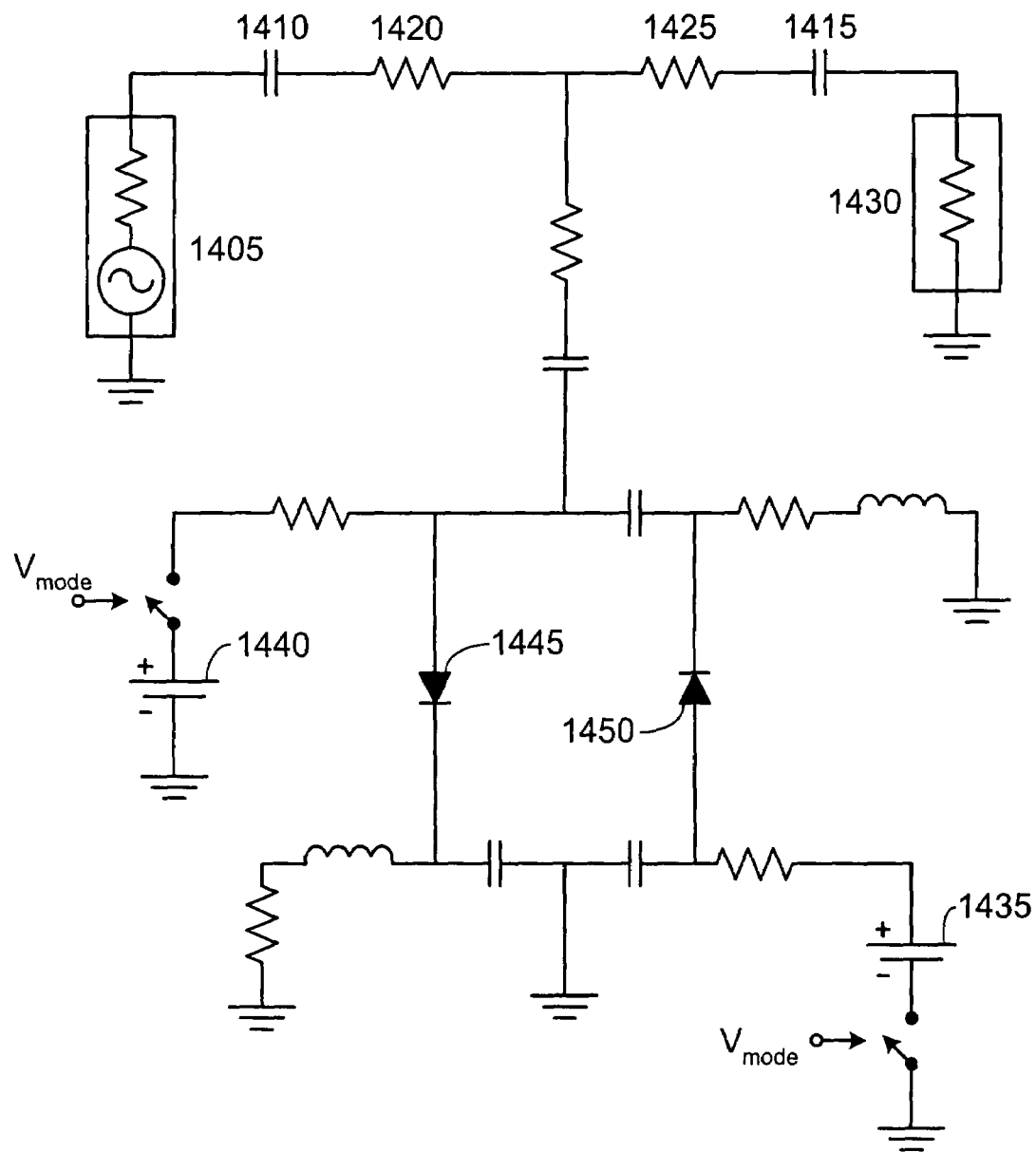
FIG. 14 shows an embodiment of the invention that incorporates a switchable cubic predistortion linearizer.

FIG. 14 illustrates a Switchable Cubic Predistortion Linearizer (SCPDL) for providing improved linearity in the HP mode without suffering significant gain degradation when in LP mode. Predistortion involves correcting for expected amplitude and phase nonlinearities due to a system, such as a power amplifier, by applying the known amplitude and phase nonlinearities into a signal in a manner opposite to that of the expected distortion. The result of passing a predistorted signal through the system is to cancel out the distortion to allow linear performance despite the presence of nonlinearities. SCPDL refers to a cubic predistortion linearizer that functions only in response to a switch. This avoids the use of a predistortion linearizer until it is actually needed. Typically, high power amplification of signal tends to suffer from non-linearities more than at low power since at low power levels it is easier to stay within the linear region by, if required, suitable biasing strategies. The term cubic typically refers to the correction or reduction in the third harmonic effected by this linearizer arrangement.

Distortion due to deviation from linear behavior is measured by various measures. A useful measure is the $3^{rd}$ order Inter-Modulation Distortion, which is described in some detail next to assist in understanding the description of an embodiment of the invention. In general, a power amplifier may be described by $y(t)=\alpha_1 x(t)+\alpha_2 x(t)^2+\alpha_3 x(t)^3+\ldots$. With two frequencies, $\omega_1$ and $\omega_2$, $x(t)=A_1 \cos \omega_1 t + A_2 \cos \omega_2 t$. Substituting this results in generating components of y(t) at, for instance, $\omega=\omega_1+\omega_2$; $2\omega_1+\omega_2$; and $2\omega_2+\omega_1$. Of particular interest, when $\omega_1$ is close to $\omega_2$; i.e., the difference between the two is small, since then components at $2\omega_1-\omega_2$ and $2\omega_2-\omega_1$ appear in the vicinity of $\omega_1$ and $\omega_2$. This results in non-linear behavior or distortion, which in the case of weak interactions can be estimated by a two tone test. In the two tone test, the amplitudes of the two interferers are typically set so that $A_1=A_2=A$. The ratio of the amplitude of the output $3^{rd}$ order products, about $3\alpha_3 A^3/4$, to $\alpha_1 A$ is a measure of Inter-Modulation Distortion (IM). Thus, if $\alpha_1 A = 1V_{pp}$, and $3\alpha_3 A^3/4 = 10\ mV_{pp}$, then the IM components are at −40 dBc, where "c" stands for with respect to the carrier.

The performance metric for third-order intermodulation of two nearby interferers is called 'the third intercept point.' It is estimated by choosing the amplitude A to be small enough that the contribution of higher order terms is negligible compared to that from first-order products. As A is increased, the contribution from higher-order products increases faster than that from first-order products. The third-order intercept point (IMD3) is defined as the amplitude at which the contributions of the third-order products and the first-order products are about equal.

In FIG. 14, an input signal is received by a predistortion linearizer from a source 1405. The signal passes through DC blocking capacitors 1410 and 1415 along with attenuating resistances 1420 and 1425. The power amplifier and its load are seen as a combined load 1430. Power mode signal, shown as $V_{mode}$, connects the power source(s) 1435 and 1440, preferably using reverse logic. In other words, a high level of the power mode signal for other parts of the power amplifier is a low signal and vice versa. This can be implemented with an inverter. However, this preference is not to be interpreted as a limitation on the scope of the invention and many other variations may also be implemented.

Figure 16:
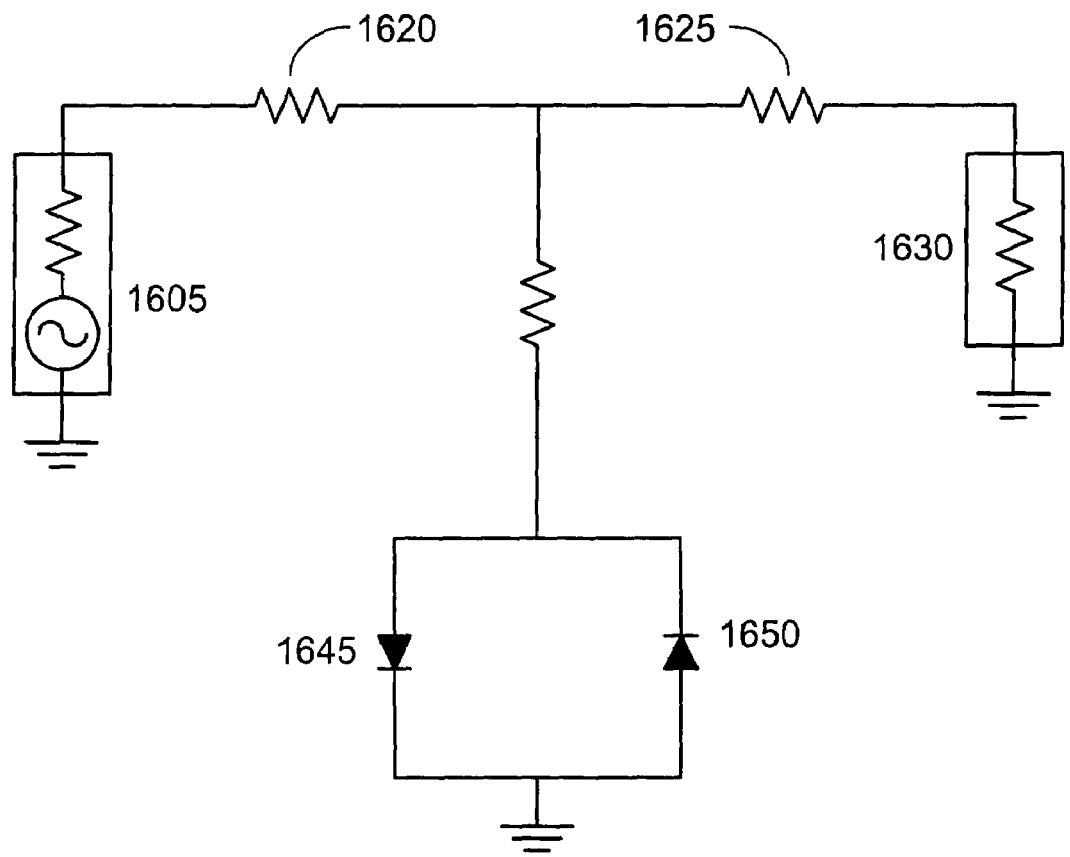
FIG. 16 illustrates a switchable cubic predistortion linearizer in an ON state.

FIG. 16 illustrates the case when the SCPDL of FIG. 14 is ON. The RF source 1605 is connected to the attenuating resistances 1620 and 1625. In addition, the RF signal may pass to the ground through diodes 1645 and 1650 as shown, which arrangement also provides a predistortion, for instance by a reduction in the third harmonic.

In an illustrative embodiment of the invention, the power mode signal SCPDL is preferably connected at the input of the power amplifier such as predistortion linearizer 1135 in FIG. 11. SCPDL functionality is invoked in the high power mode to improve the linearity of the response. Without intending to be bound by theory, it is believed that this allows better and more efficient use of a range of a power amplifier that otherwise would not be usable due to the introduction of unacceptable nonlinearities. The increased efficiency follows from the larger current swings that can be used while obtaining linear performance at the same quiescent current. This avoids the increased losses due to higher quiescent currents and larger amplifiers to ensure performance is suitably linear. Thus, a given amplifier is used more efficiently by the use of predistortion linearizer.

Figure 15:
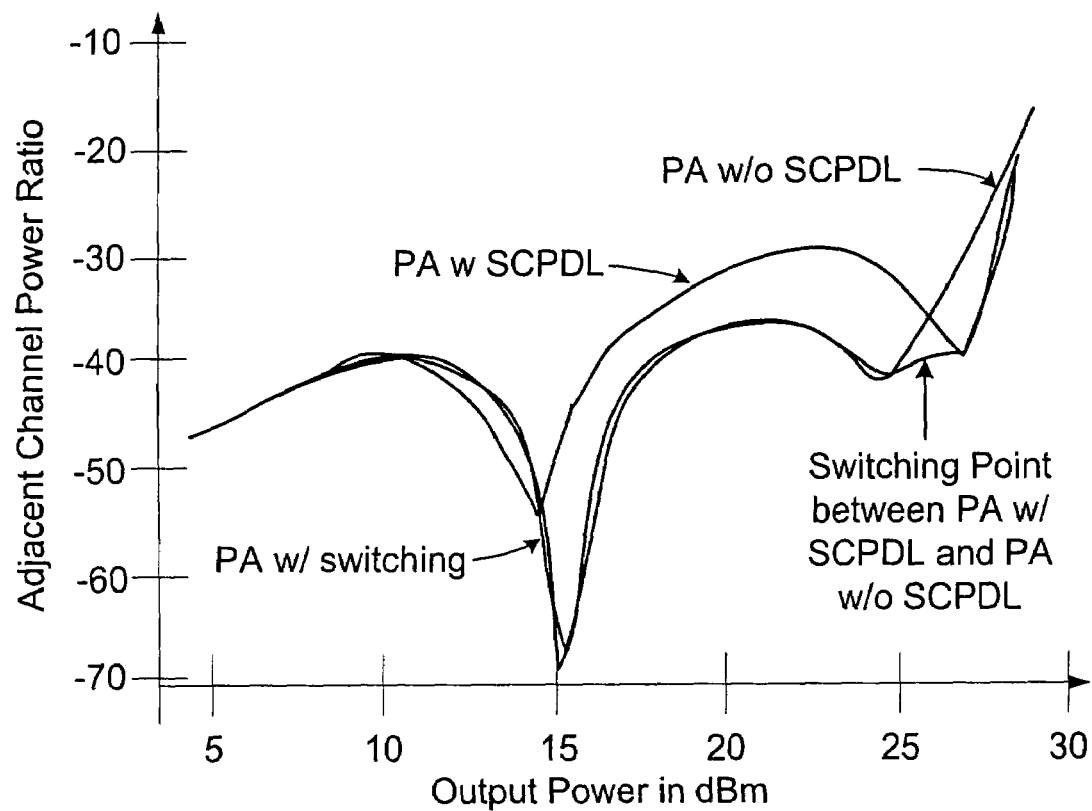
FIG. 15 illustrates the performance of a switchable cubic predistortion linearizer in improving the overall response of a power amplifier operating in multiple power modes.

FIG. 15 illustrates the performance improvements due to the Switchable Cubic Predistortion Linearizer (SCPDL) in the HP mode without suffering significant gain degradation during LP mode. Specifically, it is readily seen that the Power Amplifier with SCPDL provides a more linear performance over a broad range of Output Power. This is due to the switch made as indicated in FIG. 15 upon triggering a high power mode to also invoke SCPDL functionality. It should be noted that the high power mode merely refers to a higher power mode and not necessarily the highest power mode.

The table below presents the IMD3 values for a power amplifier using a switchable cubic predistortion linearizer:

TABLE 7

| IMD3 Improvement with Predistortion Linearizer | |
|---|---|
| $P_{out}$ (dBm) | Improvement (dB) |
| 27 | 10.2 |

TABLE 7-continued

| IMD3 Improvement with Predistortion Linearizer | |
|---|---|
| $P_{out}$ (dBm) | Improvement (dB) |
| 27.5 | 6.3 |
| 27.8 | 4.1 |
| 28.1 | 2.8 |

Figure 18:
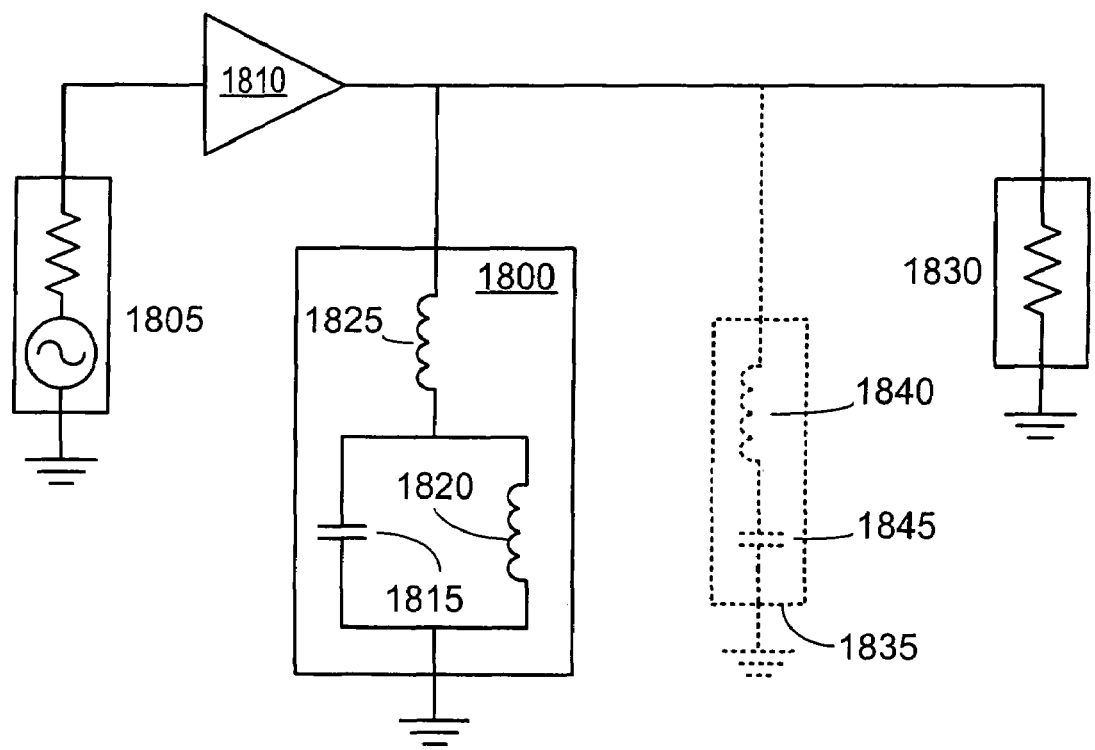
FIG. 18 illustrates an advantage of using a dual harmonic resonance filter over a LC filter in an illustrative circuit.

FIG. 18 illustrates a use of dual resonance harmonic filters as a trap in, for instance, Wireless Local Area Network (WLAN) Front End Module (FEM). Shown is source 1805 providing a signal for amplification by amplifier 1810. The amplified signal may be filtered, for instance, to remove frequency spurs by dual resonance harmonic filter 1800 or LC filter 1835 prior to being provided to load 1830. LC filter 1835 is shown by broken lines to indicate that it is less preferable to the dual resonance harmonic filter 1800. As shown, dual harmonic resonance filter 1800 has capacitor 1815 in parallel with inductor 1820 and both in series with inductor 1825. LC filter 1835 has capacitor 1845 and inductor 1840. A traditional LC trap such as LC trap 1835, has a low impedance at its intended frequency, for instance, $2f_0$, and also at $f_0$, which is not desirable since this tends to detune the matching between an amplifier and its load or source. A dual resonance trap, such as dual resonance harmonic filter 1800, provides a low impedance at, for instance, $2f_0$, but a high impedance at $f_0$, thus avoiding the risk of detuning and, thus, leaving the matching unaffected.

In the example embodiment of FIG. 11, a load is adjusted to increase the efficiency for a low power mode. In addition, the biasing currents are adjusted by current mirrors responsive to the low power mode and the phase adjusted using a phase shift circuit. The dual resonance harmonic filter reduces the second harmonic while the cubic predistortion linearizer improves the linearity, for instance, by reducing the third harmonic for a more linear operation at high power levels. The combination results in a more linear and efficient operation at both high and low power levels.

However, other combinations are possible such as dispensing with the use of the cubic predistortion linearizer in favor of another dual resonance harmonic filter to remove the third harmonic as well. As is evident to one of ordinary skill in the art, several such variations are possible within the scope of the disclosed invention with suitable placement and choice of parameters.

In general, the invention encompasses methods for providing multiple power modes in a power amplifier circuit, by providing means for phase shifting in response to a power mode signal at an input of the power amplifier; filtering means in a bias circuit for biasing at least one stage in the power amplifier circuit, wherein the filtering means present a low impedance to a harmonic of a fundamental frequency and a high impedance to the fundamental frequency; and providing loading means responsive to the power mode signal to provide a higher impedance in a lower power mode to improve efficiency in the lower power mode. In addition, a preferred embodiment of the invention may further comprise providing predistortion means that are invoked in response to the power mode signal during high power amplification by the power amplifier. Such predistortion means include the previously discussed switchable cubic predistortion linearizers and other predistortion linearizers.

Another preferred embodiment may further comprise providing serially connected amplifier stages biased by a corresponding current means responsive to the power mode signal.

Examples of such current means include the current mirrors for biasing amplifier stages in response to the power mode signal.

The power mode signal and other signals often help switch particular circuits to provide a desired behavior at a given power level. It should be further noted that although switches are generally understood to be lossy elements in a circuit, it is possible to employ lossless or reduced loss switches that operate with the current and voltage that are out of phase. If the current through the switch is a maximum when the voltage is at its minimum or even lower than the maximum possible value, then the dissipation in the switch is less than if the voltage and the current were in phase. Thus, embodiments of the invention that employ such switches are intended to be within the scope of the claimed invention. Switching means, when employed, encompass such switches unless the otherwise restricted.

The power amplifier and load switching circuits preferably are implemented as a GaAs integrated circuit. As is known to those skilled in the art, this can provide certain power and speed advantages.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. A power amplifier circuit with improved efficiency comprising:
   a power amplifier load circuit responsive to a power mode signal, including at least one switch coupled between an output of the power amplifier circuit and a ground node;
   a predistortion linearizer coupled to an input of the power amplifier circuit and responsive to the power mode signal, and
   a bias circuit including a dual resonance harmonic filter coupled between a supply node and at least one stage in the power amplifier circuit.

2. The power amplifier circuit of claim 1 wherein the predistortion linearizer is a cubic predistortion linearizer.

3. A power amplifier circuit with improved efficiency comprising:
   a power amplifier load circuit responsive to a power mode signal,
   a predistortion linearizer coupled to an input of the power amplifier circuit and responsive to the power mode signal,
   a bias circuit including a dual resonance harmonic filter coupled between a supply node and at least one stage in the power amplifier circuit, and
   a capacitor and a switch responsive to a band select signal connected to one another in series between a node in the power amplifier load circuit and the ground.

4. The power amplifier circuit of claim 3 wherein the predistortion linearizer is a cubic predistortion linearizer.

5. A power amplifier circuit responsive to a power mode signal, comprising:
   a power amplifier load circuit responsive to the power mode signal, said power amplifier load circuit having a load circuit input node connected to a power amplifier output node;
   a dual resonance harmonic filter incorporated into a biasing circuit for at least one stage of the power amplifier; and
   a switchable cubic predistortion linearizer coupled to an input of the power amplifier circuit and responsive to the power mode signal.

6. A power amplifier circuit responsive to a power mode signal, comprising:
   a power amplifier load circuit responsive to the power mode signal, said power amplifier load circuit having a load circuit input node connected to a power amplifier output node;
   a dual resonance harmonic filter incorporated into a biasing circuit for at least one stage of the power amplifier; and
   at least one amplifying stage with a current mirror for providing a bias current such that the current mirror is also responsive to the power mode signal.

7. The power amplifier circuit according to claim 6 further comprising:
   a first amplifier stage having a first current mirror circuit configured to stabilize a voltage at a first transistor base;
   a second amplifier stage having a second current mirror circuit configured to stabilize a voltage at a second transistor base, and
   wherein the first and second current mirror circuits are responsive to the power mode signal.

8. The power amplifier circuit according to claim 6 further comprising a
switchable cubic predistortion linearizer.

* * * * *